(12) United States Patent
Eun et al.

(10) Patent No.: US 11,163,640 B2
(45) Date of Patent: Nov. 2, 2021

(54) SEMICONDUCTOR MEMORY DEVICES, MEMORY SYSTEMS AND METHODS OF CONTROLLING OF REPAIR OF SEMICONDUCTOR MEMORY DEVICES

(71) Applicant: Samsung Electronics Co., Ltd., Suwon-si (KR)

(72) Inventors: Hyunglae Eun, Seongnam-si (KR); Dong Kim, Hwaseong-si (KR); Inhoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/824,660

(22) Filed: Mar. 19, 2020

(65) Prior Publication Data
US 2021/0064462 A1    Mar. 4, 2021

(30) Foreign Application Priority Data
Aug. 29, 2019    (KR) .......................... 10-2019-0106655

(51) Int. Cl.
| | |
|---|---|
| *G06F 11/10* | (2006.01) |
| *G11C 29/44* | (2006.01) |
| *G11C 11/4093* | (2006.01) |
| *G11C 11/408* | (2006.01) |

(52) U.S. Cl.
CPC ...... *G06F 11/1068* (2013.01); *G11C 11/4093* (2013.01); *G11C 29/4401* (2013.01); *G11C 11/4087* (2013.01)

(58) Field of Classification Search
CPC ............. G06F 11/1068; G11C 11/4093; G11C 29/4401; G11C 11/4087
See application file for complete search history.

(56) References Cited

U.S. PATENT DOCUMENTS

| | | |
|---|---|---|
| 4,758,992 A | 7/1988 | Taguchi |
| 8,549,366 B2 | 10/2013 | Higeta et al. |
| 8,996,956 B2 | 3/2015 | Yang et al. |
| 9,269,457 B2 | 2/2016 | Kim et al. |

(Continued)

FOREIGN PATENT DOCUMENTS

| | | |
|---|---|---|
| JP | 19940139153 A | 5/1994 |
| JP | 19960031280 B2 | 3/1996 |
| JP | 19970091206 A | 4/1997 |

*Primary Examiner* — Kyle Vallecillo
(74) *Attorney, Agent, or Firm* — Muir Patent Law, PLLC

(57) ABSTRACT

A semiconductor memory device includes a memory cell array, an error correction code (ECC) engine, an input/output (I/O) gating circuit connected between the memory cell array and the ECC engine, an error information register and a control logic circuit. The memory cell array includes a plurality of memory cell rows. The control logic circuit controls the ECC engine, the I/O gating circuit and the error information register based on a command and address. The I/O gating circuit provides the ECC engine with codewords which are read from the memory cell array through refresh operations on the plurality of memory cell rows. The ECC engine performs an ECC decoding on main data of the codewords based on parity bits of the codewords and provides error generation signals to the control logic circuit in response to detecting correctable errors with respect to a corresponding address resulting from performing the ECC decoding.

16 Claims, 25 Drawing Sheets

(56) References Cited

U.S. PATENT DOCUMENTS

| | | | |
|---|---|---|---|
| 9,589,676 B2 | 3/2017 | Choi et al. | |
| 9,620,194 B1 | 4/2017 | Lee et al. | |
| 10,193,576 B2 | 1/2019 | Eguchi | |
| 2012/0173924 A1* | 7/2012 | Xiao | G06F 11/1016 714/15 |
| 2012/0317352 A1* | 12/2012 | Kang | G11C 11/40618 711/106 |
| 2014/0068166 A1 | 3/2014 | Fukumura et al. | |
| 2014/0245105 A1* | 8/2014 | Chung | G06F 11/1076 714/763 |
| 2015/0199234 A1* | 7/2015 | Choi | G11C 29/4401 714/764 |
| 2016/0034348 A1* | 2/2016 | Park | G11C 29/42 714/764 |
| 2016/0042809 A1* | 2/2016 | Kim | G11C 29/42 714/719 |
| 2016/0055052 A1* | 2/2016 | Hu | G06F 11/1048 714/799 |
| 2016/0055056 A1* | 2/2016 | Son | G06F 11/1008 714/764 |
| 2016/0055059 A1* | 2/2016 | Hu | G06F 11/1076 714/764 |
| 2016/0155515 A1* | 6/2016 | Son | G11C 29/4401 714/719 |
| 2016/0378597 A1* | 12/2016 | Chung | H04L 1/24 714/764 |
| 2017/0060681 A1* | 3/2017 | Halbert | G06F 11/1068 |
| 2017/0083401 A1* | 3/2017 | Ryu | G06F 3/0619 |
| 2017/0139771 A1* | 5/2017 | Chung | G06F 3/0679 |
| 2017/0308299 A1* | 10/2017 | Cha | H03M 13/13 |
| 2018/0150350 A1* | 5/2018 | Cha | G06F 11/1016 |
| 2020/0019458 A1* | 1/2020 | Cadloni | G06F 11/1068 |
| 2020/0264950 A1* | 8/2020 | Schaefer | G06F 11/1004 |

* cited by examiner

FIG. 2

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

FIG. 17

| PFRADD | PFCADD | EN | ATT |
|---|---|---|---|
| RAa | CAa  CAb | 2 | N/A |
| RAb | CAc | 1 | ATT2 |
| RAc | CAb  CAd  CAe  CAf  CAg | 5 | ATT1, ATT2 |
| RAd | CAb  CAi  CAj  CAk | 4 | ATT1, ATT2 |
| RAe |  | 0 | ATT1 |
| RAf | CAb  CAh | 2 | ATT2 |
| ... | ... | ... | ... |

AET

SEMICONDUCTOR MEMORY DEVICES, MEMORY SYSTEMS AND METHODS OF CONTROLLING OF REPAIR OF SEMICONDUCTOR MEMORY DEVICES

CROSS-REFERENCE TO RELATED APPLICATIONS

This application claims the benefit of priority under 35 USC § 119 to Korean Patent Application No. 10-2019-0106655, filed on Aug. 29, 2019, in the Korean Intellectual Property Office, the disclosure of which is incorporated by reference in its entirety herein.

BACKGROUND

The present disclosure relates to memories, and more particularly to semiconductor memory devices, memory systems including the same and methods of controlling repair of the same.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, an amount of error bits of memory cells in the DRAMs may rapidly increase and yield of the DRAMs may decrease.

Storage devices such as a solid state drive (SSD) based on a flash memory may be used widely as mass storage medium of a computing device. The SSD may store data in a nonvolatile memory device such as a flash memory device and uses a volatile memory device such as a DRAM device as a buffer memory to manage various information for controlling the flash memory device. When fault is found during manufacturing processes of the DRAM device, fault or defective cells may be repaired through various repair schemes. However, when the fault is caused after the DRAM device is mounted in the SSD and the product is supplied to a user, that is, after the SSD is used at a user level, the SSD in addition to the DRAM device may not operate correctly.

SUMMARY

According to exemplary embodiments, a semiconductor memory device includes a memory cell array, an error correction code (ECC) engine, an input/output (I/O) gating circuit connected between the memory cell array and the ECC engine, an error information register and a control logic circuit. The memory cell array includes a plurality of memory cell rows, and each of the plurality of memory cell rows includes a plurality of volatile memory cells. The control logic circuit controls the ECC engine, the I/O gating circuit and the error information register based on a command and address received from an external memory controller. The I/O gating circuit provides the ECC engine with codewords which are read from the memory cell array through refresh operations on the plurality of memory cell rows. The ECC engine performs an ECC decoding on main data of the codewords based on parity bits of the codewords and provides error generation signals to the control logic circuit in response to detecting correctable errors with respect to a corresponding address resulting from performing the ECC decoding. The control logic circuit stores error information in the error information register by accumulating location information having the correctable errors, based on the error generation signals.

According to exemplary embodiments, a memory system includes a semiconductor memory device and a memory controller to control the semiconductor memory device. The semiconductor memory device includes a memory cell array, a first error correction code (ECC) engine, an input/output (I/O) gating circuit connected between the memory cell array and the first ECC engine, an error information register and a control logic circuit. The memory cell array includes a plurality of memory cell rows, and each of the plurality of memory cell rows includes a plurality of volatile memory cells. The control logic circuit controls the first ECC engine, the I/O gating circuit and the error information register based on a command and address received from the memory controller. The I/O gating circuit provides the first ECC engine with codewords which are read from the memory cell array through refresh operations on the plurality of memory cell rows. The first ECC engine performs an ECC decoding on main data of the codewords based on parity bits of the codewords and is configured to provide error generation signals to the control logic circuit in response to detecting correctable errors with respect to a corresponding address resulting from performing the ECC decoding. The control logic circuit stores error information in the error information register by accumulating location information having the correctable errors, based on the error generation signals.

According to exemplary embodiments, there is provided a method of controlling repair of a semiconductor memory device, and the semiconductor memory device includes an error correction code (ECC) engine, an error information register and a memory cell array including a plurality of memory cell rows, each including a plurality of volatile memory cells. In the method, the ECC engine is provided with codewords including main data and parity bits read from the memory cell array through refresh operations on the plurality of memory cell rows, by the ECC engine an ECC decoding is performed on the main data based on the parity bits to detect correctable errors with respect to a corresponding address, error information is stored in the error information register by accumulating location information having the correctable errors, and a run-time repair operation is performed with respect to the semiconductor memory device to repair the correctable errors based on the error information stored in the error information register.

Accordingly, the semiconductor memory device accumulates error information during refresh operations, which is associated with errors which occur in run-time of the semiconductor memory device, and efficiently manages errors occurring in the run-time based on the accumulated error information without reading operation on data of the memory cell array. Therefore, the semiconductor memory device and a system including the semiconductor memory device may enhance performance and life-time due to efficient error management.

BRIEF DESCRIPTION OF THE DRAWINGS

Exemplary embodiments will be described below in more detail with reference to the accompanying drawings.

FIG. 2 is a diagram for describing on-die ECC levels according to data bits and parity bits.

FIG. 17 is a diagram illustrating an accumulated error table for a method of controlling repair of a semiconductor memory device according to exemplary embodiments.

DETAILED DESCRIPTION

Various exemplary embodiments will be described more fully hereinafter with reference to the accompanying drawings, in which exemplary embodiments are shown.

Figure 1:
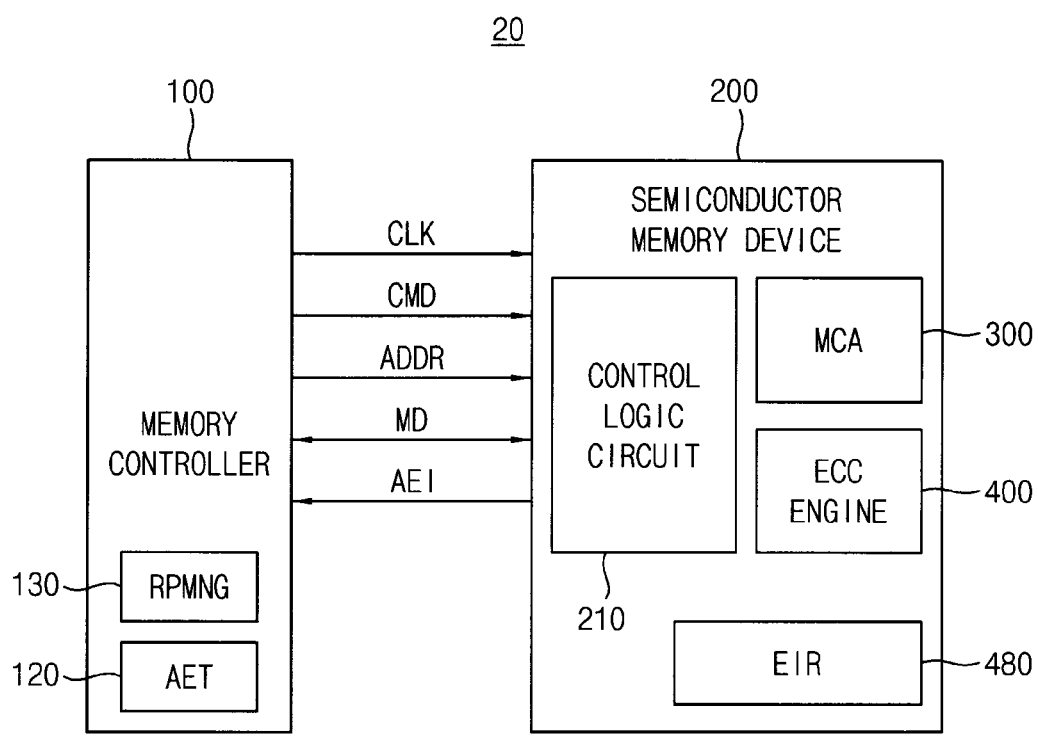
FIG. 1 is a block diagram illustrating a memory system according to exemplary embodiments.

FIG. 1 is a block diagram illustrating a memory system according to exemplary embodiments.

Figure 25:
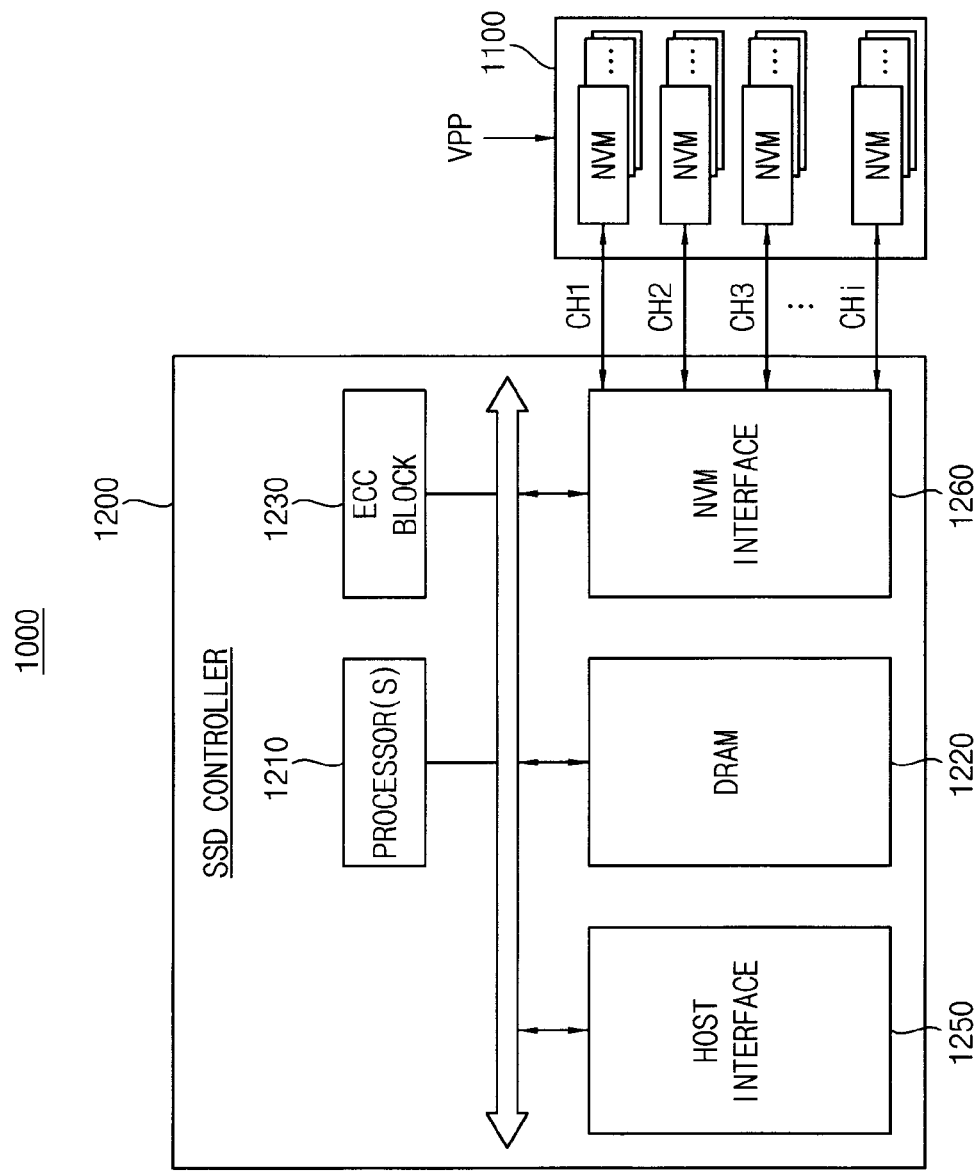
FIG. 25 illustrates a block diagram of a solid state disk or solid state drive (SSD) according to exemplary embodiments.

Referring to FIG. 1, a memory system 20 may include a memory controller 100 and a semiconductor memory device 200. In some embodiments, the memory system 20 may be a solid state drive 1000 as shown in FIG. 25.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In some exemplary embodiments, the semiconductor memory device 200 is a memory device including dynamic memory cells such as a dynamic random access memory (DRAM), double data rate 4 (DDR4) synchronous DRAM (SDRAM), a DDR5 SDRAM, a low power DDR4 (LPDDR4) SDRAM, or a LPDDR5 SDRAM.

The memory controller 100 transmits a clock signal CLK, a command CMD, and an address (signal) ADDR to the semiconductor memory device 200 and exchanges main data MD with the semiconductor memory device 200. The semiconductor memory device 200 transmits accumulated error information AEI to the memory controller 100.

The memory controller 100 may determine an error management policy on defective cells in the semiconductor memory device 200 based on the accumulated error information AEI.

The semiconductor memory device 200 includes a memory cell array 300 that stores the main data MD and parity bits, an error correction code (ECC) or error check and correction engine 400, a control logic circuit 210, and an error information register 480.

The ECC engine 400 may perform ECC encoding on a write data to generate parity bits and to store the write data and the parity bits in a target memory cell row (a target page) of the memory cell array 300, and may perform ECC decoding on a codeword CW read from the target page under control of the control logic circuit 210. The codeword CW may include main data and parity bits. In addition, the ECC engine 400 may perform an ECC decoding on the main data based on the parity bits provided from the memory cell array 300 through periodic or non-periodic refresh operations on the memory cell rows in the memory cell array 300 and may provide error generation signals to the control logic circuit 210 in response to detecting correctable errors, in a patrol scanning mode (e.g., a monitoring operation or a patrol read operation). For performing the refresh operations periodically or non-periodically in the patrol scanning mode the memory controller may apply a command to the semiconductor memory device. If the semiconductor memory device detects a defective memory cell row or column having correctable errors resulting from performing the ECC decoding, the correctable errors can be corrected during a post package repair (PPR) operation. The control logic circuit 210 may store error information in the error information register 480 by accumulating location information of the correctable errors, based on the error generation signals. The location information may include a bank address, a row address and/or a column address associated with a memory cell row or column having the correctable errors.

The memory controller 100 may include a repair manager (RPMNG) 130 and an accumulated error table (AET) 120. The RPMNG 130 may read contents in the error information register 480 as the accumulated error information AEI and may store the accumulated error information AEI in the AET 120. The repair manager 130 may determine (analyze) error attribute of each of candidate defective memory rows in which correctable errors occur based on the accumulated error information AEI stored in the accumulated error table 120 and may determine error management policy on the candidate defective memory rows based on the determined error attribute.

FIG. 2 is a diagram illustrating on-die ECC levels according to data bits and parity bits.

In FIG. 2, SEC represents single error correction, DED represents double error detection, and DEC represents double error correction. FIG. 2 illustrates parity bits and corresponding size overheads of the parity bits (PARITY O/H).

As illustrated in FIG. 2, as the number of parity bits is increased with respect to the same number of data bits, e.g., as the ratio of the number of parity bits to the number of data bits is increased, a capability of error detection and correction is increased. As the number of data bits is increased with respect to the same capability of error detection and correction, the corresponding number of parity bits is increased but the ratio of the number of parity bits to the number of data bits is decreased.

As such, the error detection capability and/or the error correction capability may be increased as the ratio of the number of parity bits to the corresponding number of data bits is increased. As a result, the on-die ECC level may be raised as the ratio of the number of parity bits to the corresponding number of data bits is increased. However, the error correction capability is limited because the real memory capacity is decreased as the number of parity bits is increased.

According to exemplary embodiments, the failure of the semiconductor memory device 200 may be prevented by performing the runtime repair operation based on the accumulated error information and the error attribute with a relatively low error correction capability. Here, the failure of the semiconductor memory device indicates that an uncorrectable error by the ECC function has occurred in the volatile memory device. The runtime repair operation indicates an operation to replace addresses in which the errors have occurred with repair addresses for preventing correctable errors from being changed to uncorrectable errors while a device or a system including the semiconductor memory device (volatile memory device) is operating. Therefore, the semiconductor memory device or the memory system including the semiconductor memory device may enhance performance and life-time by efficiently managing errors which occur during runtime.

Figure 3:
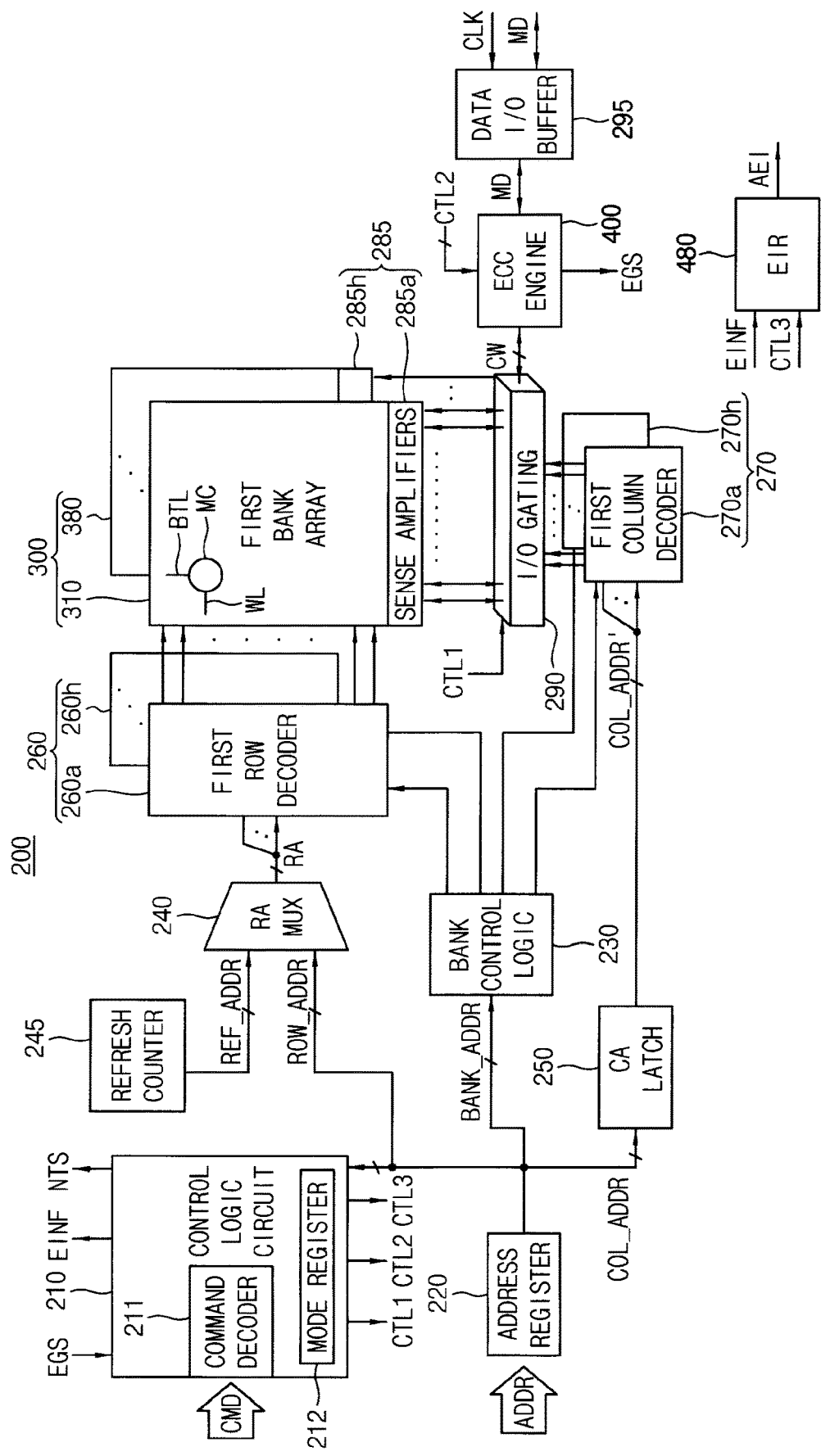
FIG. 3 is a block diagram illustrating a semiconductor memory device in FIG. 1 according to exemplary embodiments.

FIG. 3 is a block diagram illustrating the semiconductor memory device in FIG. 1 according to exemplary embodiments.

Referring to FIG. 3, the semiconductor memory device 200 includes the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, the ECC engine 400, an error information register 480 and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The refresh counter 245 may sequentially increase or decrease the refresh row address REF_ADDR under control of the control logic circuit 210.

The activated one of the first through eighth bank row decoders 260a~260h, by the bank control logic 230, decodes the row address RA that is output from the row address multiplexer 240 and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some embodiments, in a burst mode, the column address latch 250 generates column addresses COL_ADDR' that increment from the received column address COL_ADDR. The column address latch 250 applies the temporarily stored or generated column address COL_ADDR' to the first through eighth bank column decoders 270a~270h.

The activated one of the first through eighth bank column decoders 270a~270h activates a sense amplifier corresponding to the bank address BANK_ADDR and the column address COL_ADDR' through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380. As an example, the I/O gating circuit 290 may have first through eighth bank I/O gating circuits 290a-290h respectively coupled to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310~380 may be provided to the data I/O buffer 295 from the memory controller 100, may be provided to the ECC engine 400 from the data I/O buffer 295, the ECC engine 400 may perform an ECC encoding on the main data MD to generate parity bits, the ECC engine 400 may provide the main data MD and the parity bits to the I/O gating circuit 290 and the I/O gating circuit 290 may write the main data MD and the parity bits in a sub-page of a target page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The ECC engine 400 performs an ECC decoding on a codeword CW read from a sub-page of the target page and may correct at least one error bit when the at least one error bit is detected in the main data MD in the codeword CW in a normal read operation of the semiconductor memory device 200.

The ECC engine 400 may perform an ECC decoding on sensed data and parity bits provided from the memory cell array 300 through periodic or non-periodic refresh operations on the memory cell rows in the memory cell array 300 and may provide an error generation signal EGS to the control logic circuit 210 in response to detecting correctable errors, in a patrol scanning mode. The control logic circuit 210 may store a row address and/or a column address of the codeword CW including the correctable errors as error information EINF in the error information register 480. The control logic circuit 210 may store the error information EINF in the error information register 480 by accumulating location information (e.g., address) corresponding to the correctable errors, based on the error generation signal EGS.

The control logic circuit 210 may control the error information register 480 to provide the error information EINF accumulated in the error information register 480 as the accumulated error information AEI to the memory controller 100, in response to a register read command from the memory controller 100. The memory controller 100 may perform a register read operation by reading the accumulated error information AEI from the error information register 480 in response to the register read command. In addition, the control logic circuit 210 may provide a notification signal NTS to the memory controller 100 when storage space of the error information register 480 is full by accumulating the error information EINF. The memory controller 100 may apply the register read command to the semiconductor memory device 200 in response to the notification signal NTS.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400, and a third control signal CTL3 to control the error information register 480.

The error information register 480 may provide to the memory controller 100 with the error information EINF which is accumulated as the accumulated error information AEI via one of a dedicated pin or a data I/O pin in response to the third control signal CTL3.

Figure 4:
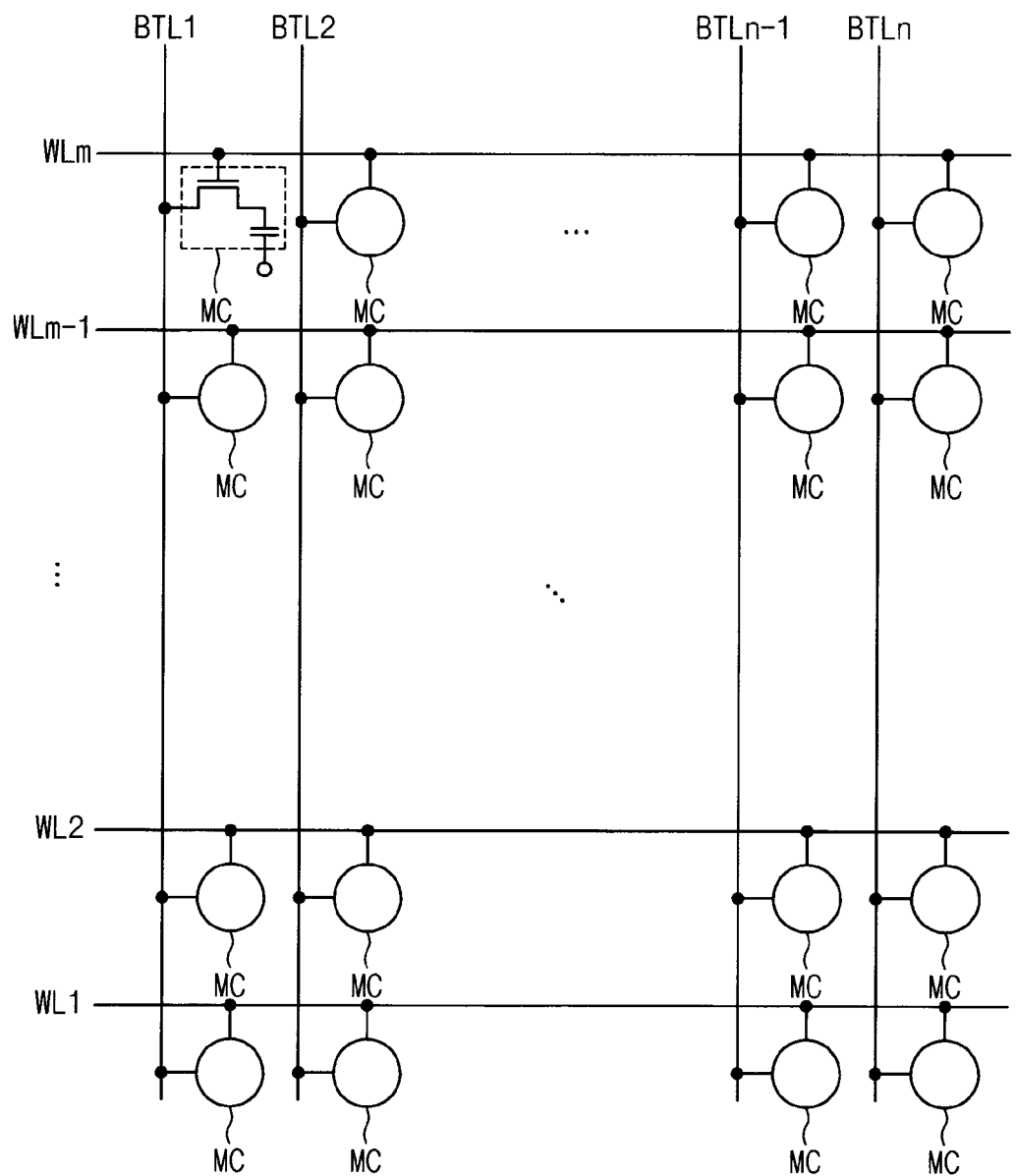
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310 includes a plurality of word-lines WL1~WLm (m is a natural number equal to or greater than two), a plurality of bit-lines BTL1~BTLn (n is a natural number equal to or greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

Figure 5:
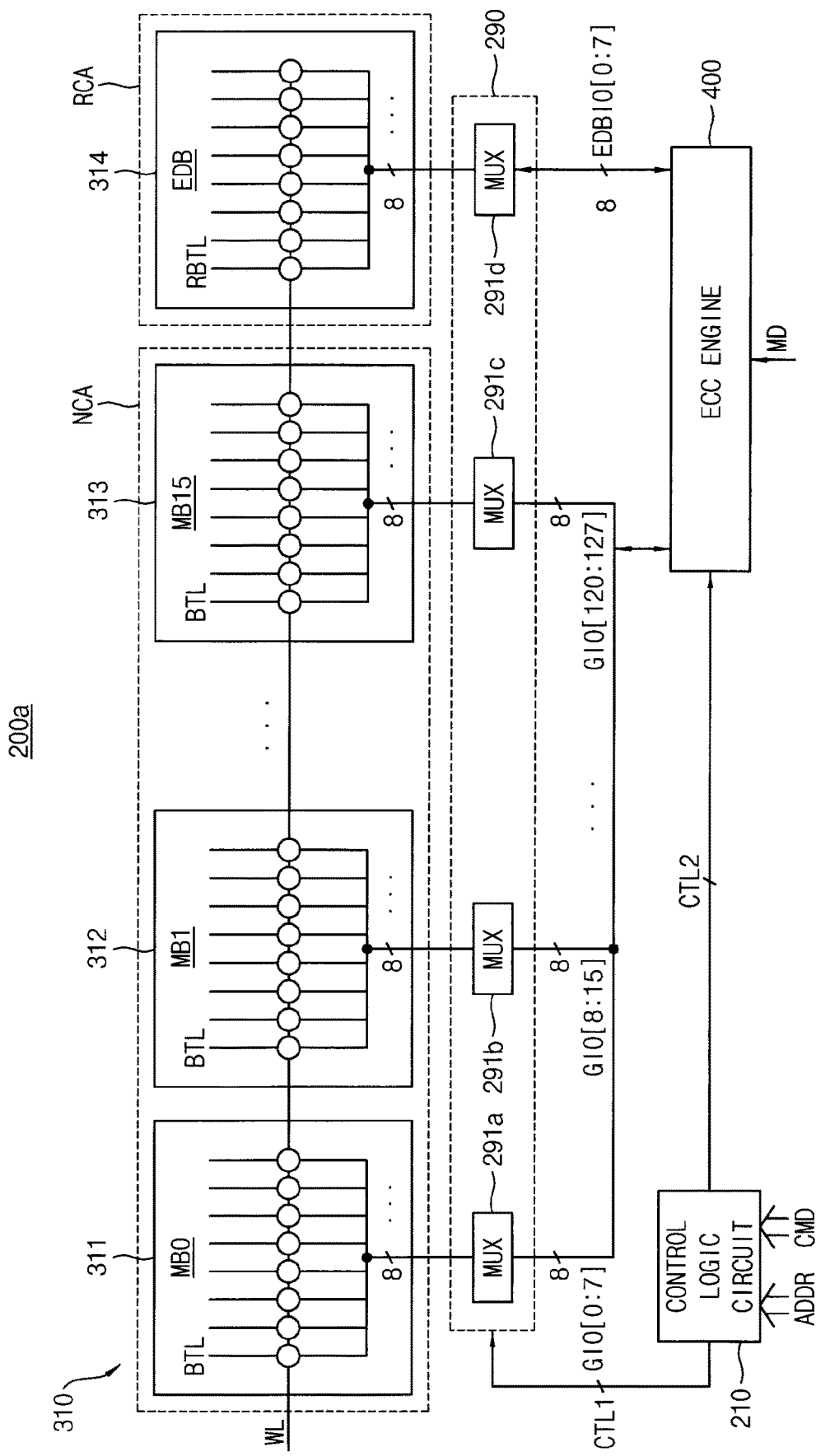
FIG. 5 illustrates a portion of the semiconductor memory device of FIG. 3 in a write operation.

FIG. 5 illustrates a portion of the semiconductor memory device of FIG. 3 in a write operation.

In FIG. 5, the control logic circuit 210, the first bank array 310, the I/O gating circuit 290, and the ECC engine 400 are illustrated.

Referring to FIG. 5, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The plurality of first memory cells connected to intersections of the word-lines WL and the bit-lines BTL may be dynamic memory cells. The plurality of second memory cells connected to intersections of the word-lines WL and bit-lines RBTL may be dynamic memory cells.

The I/O gating circuit 290 includes a plurality of switching circuits 291a-291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC engine 400 may be connected to the switching circuits 291a-291d through first data lines GIO [0:127] and second data lines EDBIO [0:7]. The control logic circuit 210 may receive the command CMD and the address ADDR and may decode the command CMD to generate the first control signal CTL1 for controlling the switching circuits 291a-291d and the second control signal CTL2 for controlling the ECC engine 400.

When the command CMD is a write command, the control logic circuit 210 provides the second control signal CTL2 to the ECC engine 400 and the ECC engine 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW may be stored in a sub-page of the target page in the first bank array 310 through corresponding data lines of the first data lines GIO [0:127] and the second data lines EDBIO [0:7].

Figure 6:
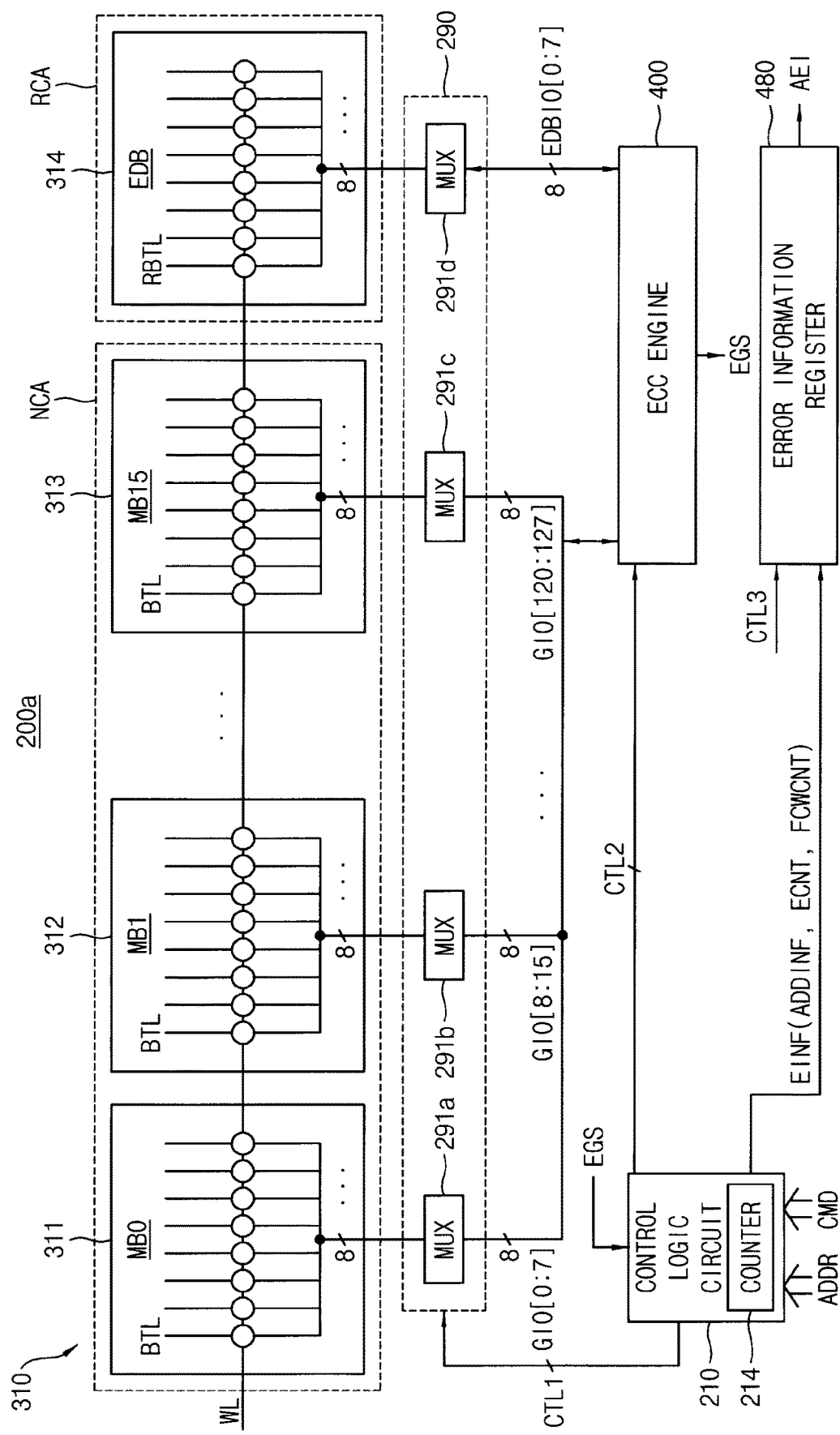
FIG. 6 illustrates the semiconductor memory device of FIG. 3 in a read operation or a refresh operation.

FIG. 6 illustrates the semiconductor memory device of FIG. 3 in a read operation or a refresh operation.

In FIG. 6, the control logic circuit 210, the first bank array 310, the I/O gating circuit 290, the ECC engine 400 and the error information register 480 are illustrated.

Referring to FIG. 6, when the command CMD is a refresh command to designate a refresh operations (periodic or non-periodic) or a read command to designate a read operation, the control logic circuit 210 provides the first control signal CTL1 to the I/O gating circuit 290 such that the codeword CW stored in the sub-page of the target page in the first bank array 310 is provided to the ECC engine 400 through corresponding data lines of the first data lines GIO [0:127] and the second data lines EDBIO [0:7].

During performing the refresh operation in the patrol scanning mode, the ECC engine 400 performs an ECC decoding on the codeword CW, and provides the error generation signal EGS to the control logic circuit 210 whenever a correctable error is detected in the codeword CW. A counter 214 in the control logic circuit 210 counts the error generation signal EGS and the control logic circuit 210 records the error information EINF in the error information register 480. The error information EINF may include a number of error occurrences of a selected memory cell row based on counting the error generation signal EGS.

In the read operation, the ECC engine 400 performs an ECC decoding on the codeword CW of each of sub-pages in the memory cell rows, may correct the correctable error if the ECC engine 400 detects the correctable error bit in the codeword CW and may output corrected main data C_MD. The control logic circuit 210 may provide the second control signal CTL2 to the ECC engine 400 and the ECC engine 400 may perform the ECC decoding.

The error information EINF may include address information ADDINF, a number of correctable error occurrences ECNT, and a number of sub-pages including error bits FCWCNT.

Figure 7:
FIG. 7 illustrates an error information register in the semiconductor memory device of FIG. 3 according to exemplary embodiments.

FIG. 7 illustrates the error information register in the semiconductor memory device of FIG. 3 according to exemplary embodiments.

Referring to FIG. 7, each of indexes (e.g., entries) Idx1, Idx2, . . . , Idxu (u is a natural number greater than two) may include page error information on each of some pages of memory cell array 300. Each entry may correspond to one of the pages. The error information register 480 includes a plurality of columns 481, 482, and 483.

The first column 481 stores address information ADDINF of each of the some pages (candidate defective memory cell rows). In an exemplary embodiment, the address information ADDINF includes at least one of a bank group address ('BGA'), a bank address ('BA'), and a row address ('RA'). While FIG. 3 illustrated a single group of bank arrays (e.g., 310-380), additional groups of bank arrays may be present. The bank group address may identify one of these groups. For example, if there is a first group of bank arrays including bank arrays 310-380 and a second group of bank arrays, and the errors are occurring in the first group of bank arrays, the BGA would identify the first group. The bank address may identify one of the bank arrays of the identified group. The row address may identify a page of the one bank.

The second column 482 stores the number of correctable error occurrences ECNT of each of the candidate defective memory cell rows. For example, the error information register 480 of FIG. 7 illustrates the number of correctable error occurrences ECNT for a page having address A is 2 and the number of correctable error occurrences ECNT for a page having address B is 4.

The third column 483 stores a number of sub-pages FCWCNT including error bits, of each of the some pages. For example, if a second page assigned by an address B has 4 error bits (ECNT=4), the second page has 64 sub-pages, but only 3 sub-pages of the 64 sub-pages have error bits (e.g., each of sub-pages 1 and 12 has 1 error bit and a sub-page 43 has 2 error bits), the entry of the second page would have a FCWCNT of 3.

Figure 8:
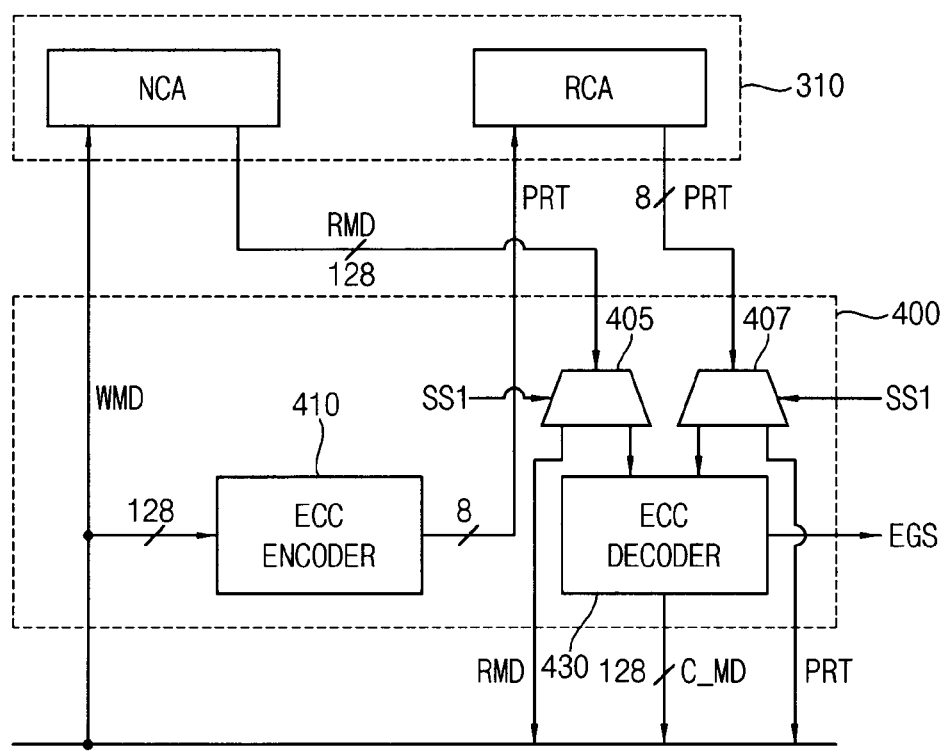
FIG. 8 is a block diagram illustrating an ECC engine in the semiconductor memory device of FIG. 3 according to exemplary embodiments.

FIG. 8 is a block diagram illustrating the ECC engine in the semiconductor memory device of FIG. 3 according to exemplary embodiments.

Referring to FIG. 8, the ECC engine 400 includes selection circuits 405 and 407, an ECC encoder 410 and an ECC decoder 430.

The ECC encoder 410 may generate parity bits PRT associated with a write data WMD to be stored in the normal cell array NCA of the first bank array 310.

The selection circuit 405 provides a read data RMD read from the first bank array 310 to one of the data I/O buffer 295 and the ECC decoder 430 in response to a first selection signal SS1. The selection circuit 407 may provide the parity bits PRT read from the first bank array 310 to one of the data I/O buffer 295 and the ECC decoder 430 in response to the first selection signal SS1.

The ECC decoder 430 may perform an ECC decoding on the read data RMD based on the parity bits PRT in a read operation of the semiconductor memory device 200. When the read data RMD includes at least one error bit as a result of the ECC decoding, the ECC decoder 430 corrects the error bit in the read data RMD to output the corrected main data C_MD.

In example embodiments, the ECC decoder 430 may perform an ECC decoding on the read data RMD based on the parity bits PRT during performing refresh operations on the memory cell rows in a patrol scanning mode. When the read data RMD includes a correctable error as a result of the ECC decoding, the ECC decoder 430 provides the error generation signal EGS to the control logic circuit 210. In example embodiments, during performing refresh operations on the memory cell rows in a patrol scanning mode, the ECC decoder 430 may not correct the error bit in the read data RMD and may not output the corrected main data C_MD.

The first selection signal SS1 may be included in the second control signal CTL2.

In a read operation, in response to the first selection signal SS1, when the selection circuit 405 provides the read data RMD to the data I/O buffer 295 and the selection circuit 407 provides the parity bits PRT to the data I/O buffer 295, the data I/O buffer 295 may transmit the read data RMD and the parity bits PRT to the memory controller 100. In this case, the memory controller 100 may include an ECC engine and the ECC engine of the memory controller performs an ECC operation such as ECC encoding and ECC decoding.

Figure 9:
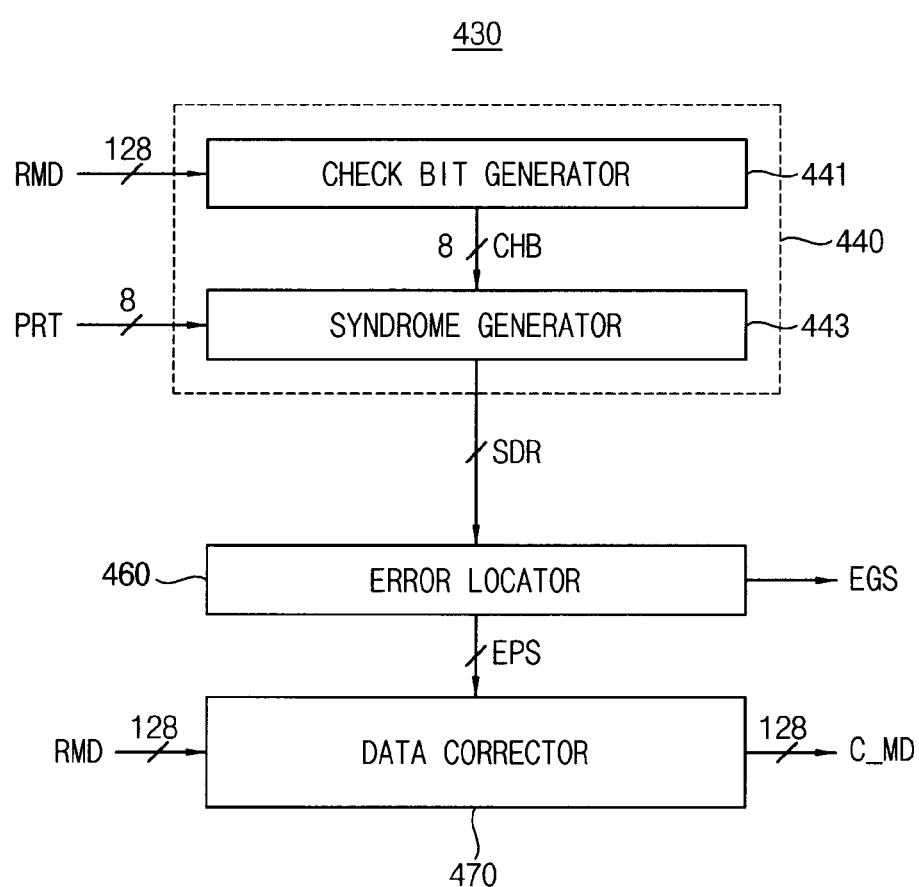
FIG. 9 illustrates an ECC decoder in the ECC engine of FIG. 8 according to exemplary embodiments.

FIG. 9 illustrates the ECC decoder in the ECC engine of FIG. 8 according to exemplary embodiments.

Referring to FIG. 9, the ECC decoder 430 may include a syndrome generation circuit 440, an error locator 460 and a data corrector 470. The syndrome generation circuit 440 may include a check bit generator 441 and a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error positon signal EPS to the data corrector 470 when all bits of the syndrome SDR are not 'zero'. In addition, when the read data RMD includes the error bit, the error locator 460 provides the error generation signal EGS to the control logic circuit 210.

The data corrector 470 receives the read data RMD, corrects the error bit in the read data RMD based on the error position signal EPS when the read data RMD includes the error bit and outputs the corrected main data C_MD.

Figure 10:
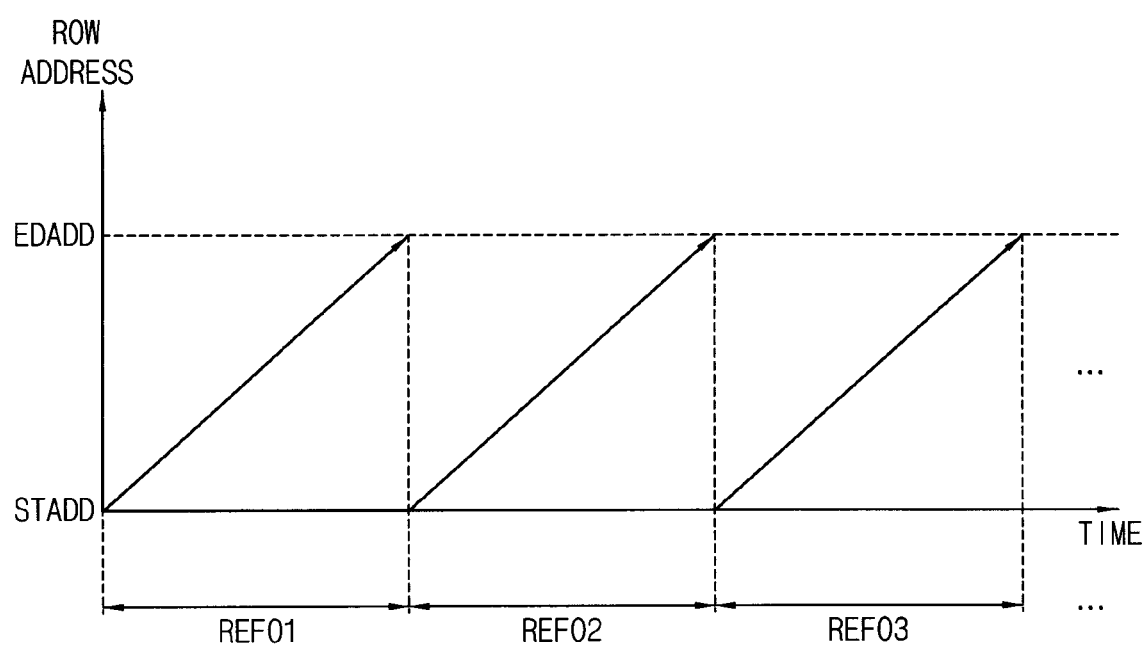
FIG. 10 diagram illustrating a refresh operation in a patrol scanning mode of the semiconductor memory device according to exemplary embodiments.

FIG. 10 diagram illustrating a refresh operation in a patrol scanning mode of the semiconductor memory device according to exemplary embodiments.

Referring to FIG. 10, a plurality of periodic refresh operations REFO1, REFO2 and REFO3 may be performed repeatedly. For example, each refresh operation may be performed from a start row address STADD to an end row address EDADD of entire row addresses of the semiconductor memory device 200. In some examples, the refresh operations may be performed non-periodically.

Figure 11:
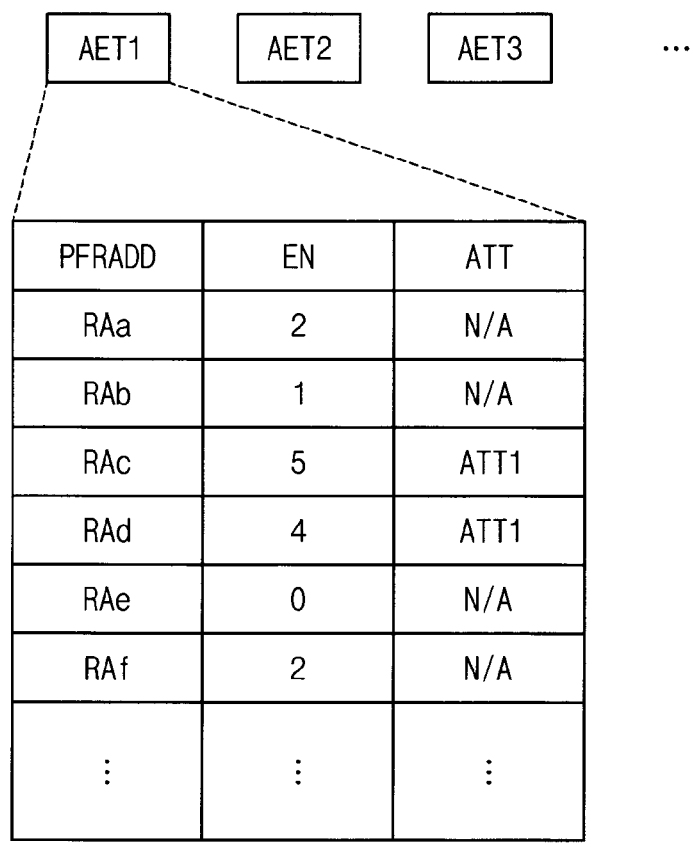
FIG. 11 is a diagram illustrating an accumulated error table in the memory controller of FIG. 1 according to exemplary embodiments.

FIG. 11 is a diagram illustrating an accumulated error table in the memory controller of FIG. 1 according to exemplary embodiments.

An accumulated error table may be generated and managed with respect to each of a plurality of bank arrays. FIG. 11 illustrates, as an example, three accumulated error tables AET1, AET2 and AET3 corresponding to three bank arrays, and an example of the accumulated error information stored in the one accumulated error table AET1.

Candidate defective row addresses (PFRADD) RAa~RAf having correctable errors among entire row addresses of the semiconductor memory device 200 and the number of correctable errors (EN) 2, 1, 5, 4, 0 and 2 respectively corresponding to the candidate defective row addresses RAa~RAf may be stored in the accumulated error table AET1 as the accumulated error information AEI. For example, FIG. 11 shows that the number of correctable errors of the candidate defective row address RAa is 2, the number of correctable errors of the candidate defective row address Rad is 4, and the like. ATT indicates the above-described error attribute. N/A indicates that the error attribute is not determined and imposed to the corresponding candidate defective row address. For example, when the number of correctable errors of a corresponding candidate defective row address is equal to or lower than a reference number of 2, the ATT may be indicated as N/A. For example, the post package operation (PPR) may not need to perform on the candidate defective row address assigned N/A. FIG. 11 shows an example that one error attribute ATT1 is imposed to the candidate defective row addresses RAc and Rad. For example, the post package operation (PPR) may be performed to repair errors of the candidate defective row addresses RAc and Rad.

The candidate defective row addresses (PFRADD) and the number of correctable errors (EN) may correspond to the address information ADDINF and the number of correctable error occurrences ECNT in FIG. 7.

Figure 12:
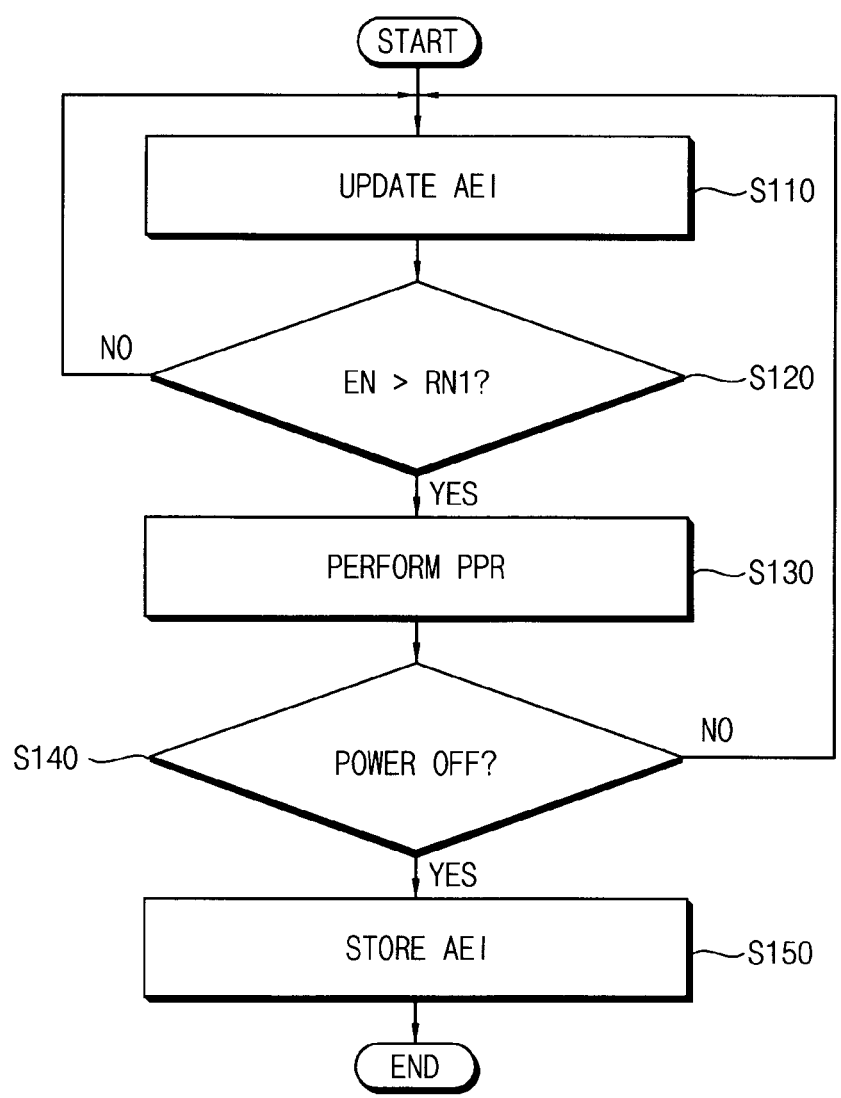
FIG. 12 is a flow chart illustrating a method of controlling repair of a semiconductor memory device according to exemplary embodiments.

FIG. 12 is a flow chart illustrating a method of controlling repair of a semiconductor memory device according to exemplary embodiments.

Referring to FIG. 12, the accumulated error information AEI may be updated (S110) whenever the register read operation is performed once.

It is determined whether the number of correctable errors EN is greater than a first reference number RN1 with respect to each of the candidate defective row addresses included in the accumulated error information AEI (S120). When the number of correctable errors EN of at least one of the candidate defective row addresses is greater than the first reference number RN1 (S12: YES), a post package repair (PPR) operation is performed (S130) with respect to all of the candidate defective row addresses corresponding to the number of correctable errors EN greater than the first reference number RN1. When the number of correctable errors EN of each of all the candidate defective row addresses is not greater than the first reference number RN1 (S120: NO), the refresh operation on the memory cell rows is performed to update the accumulated error information AEI and it is determined again whether the post package repair operation is required based on the updated accumulated error information AEI. In some embodiments, the first reference number may be stored in a register included in a memory controller or a semiconductor memory device.

Such a sequence of the refresh operation in the patrol scanning mode may be repeated until the semiconductor memory device 200 is powered off (S140: NO). The accumulated error information AEI and the error attribute ATT may be stored in a nonvolatile memory device (S150) when the semiconductor memory device 200 is powered off. The accumulated error information AEI and the error attribute ATT may be loaded from the nonvolatile memory device to the accumulated error table AET 120 when the semiconductor memory device 200 is powered on again so that the method of controlling repair of the semiconductor memory device 200 according to example embodiments may be performed continuously even though the semiconductor memory device 200 is powered off.

Figure 13:
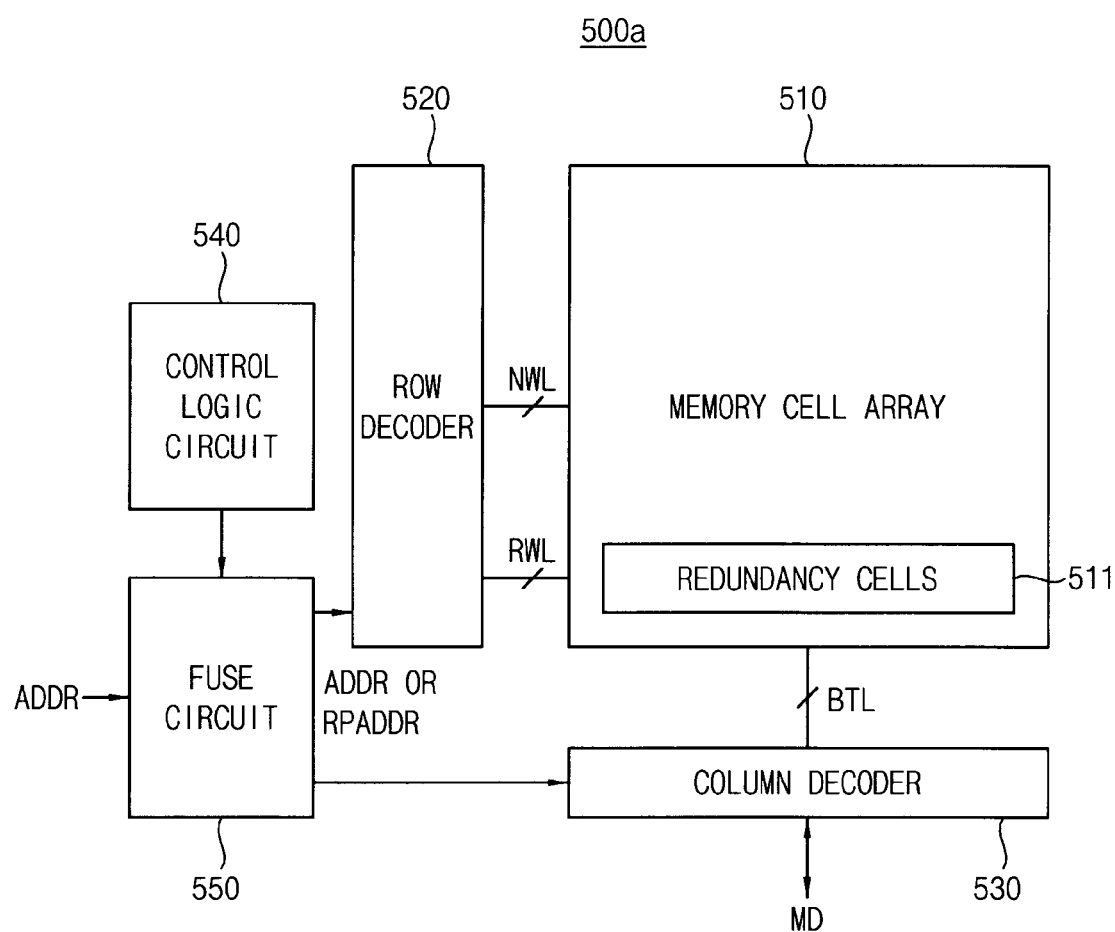
FIG. 13 is a block diagram illustrating a semiconductor memory device performing a post package repair operation.

FIG. 13 is a block diagram illustrating a semiconductor memory device performing a post package repair operation according to example embodiments. For convenience of illustration and description, only components for describing the post package repair operation are illustrated.

Referring to FIG. 13, a semiconductor memory device 500a may include a memory cell array 510, a row decoder 520, a column decoder 530, a control logic circuit 540 and a fuse circuit 550.

The memory cell array 510 may include a plurality of DRAM cells. The DRAM cells may be connected to word-lines NWL and RWL and bit-lines BTL, respectively. A portion of the DRAM cells may be normal cells and another portion of the DRAM cells may be redundancy cells 511 for replacing failed cells among the normal cells. The word-lines NWL may be normal word-lines connected to the normal cells and the word-lines RWL may be redundancy word-lines connected to the redundancy cells 511.

The row decoder 520 may be connected to the memory cell array 510 through the word-lines NWL and RWL. The row decoder 520 may select one of the word-lines based on an address ADDR (that is, a row address in the address ADDR), and control a voltage of the selected word-line.

The column decoder 530 may be connected to the memory cell array 510 through the bit-lines BTL. The column decoder 530 may select a portion of the bit-lines based on the address ADDR (that is, a column address in the address ADDR), and control or detect voltages of the selected bit-lines to output the main data MD.

The control logic circuit 540 may control an overall operation of the semiconductor memory device 500a. A fuse setting operation may be performed under control of the control logic circuit 540. The control logic circuit 540 may be configured to set the fuse-setting of the fuse circuit 550 by the runtime repair operation. The normal cells may be replaced with the redundancy cells 511 through the fuse-setting of the fuse circuit 550. For example, the fuse circuit 550 may receive the address ADDR from the memory controller. When the row address in the address ADDR corresponds to the normal word-line NWL that is determined as the defective word-line, the fuse circuit 550 may output a repair address RPADDR so that the row decoder 520 may select the redundancy word-line RWL instead of the normal word-line NWL.

For example, the fuse circuit 550 may determine the fuse-setting so that the row address corresponding to the defective address may be converted to the repair address. The row decoder 520 may select the redundancy word-line RWL based on the repair address from the fuse circuit 550. The fuse circuit 550 may transfer the row address that does not correspond to the failed address to the row decoder 520 without conversion. As such, the semiconductor memory device 500a may perform the post package repair operation with respect to the failed address through the electrical fuse-setting of the fuse circuit 550.

Figure 14:
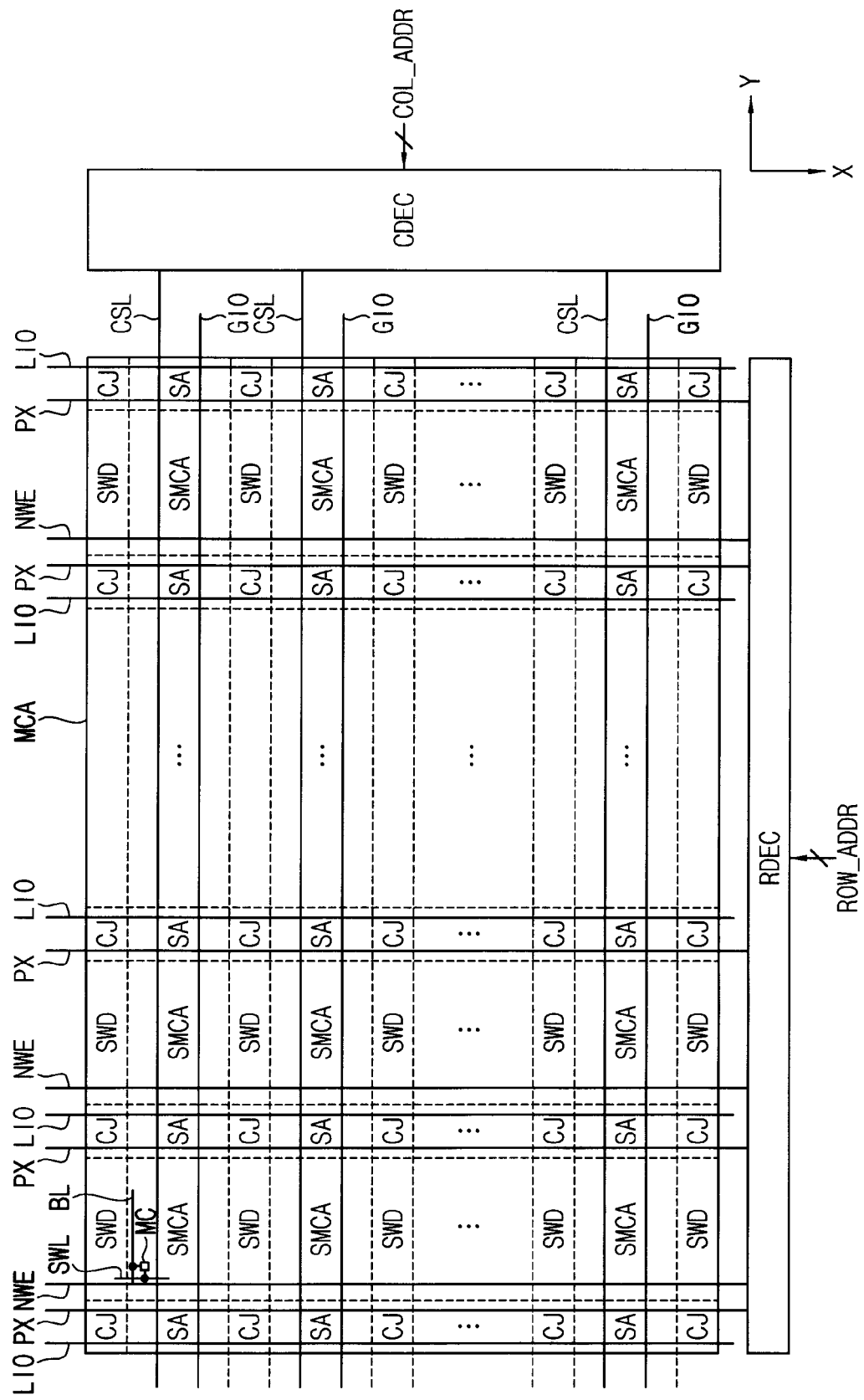
FIG. 14 is a diagram illustrating a layout of a memory cell array included in a semiconductor memory device according to exemplary embodiments.

FIG. 14 is a diagram illustrating a layout of a memory cell array included in a semiconductor memory device according to exemplary embodiments.

FIG. 14 illustrates a memory cell array region MCA, a column decoder CDEC, and a row decoder RDEC and other components of the semiconductor memory device are omitted for convenience of illustration. The memory cell array region MCA includes a dual word-line structure including a main word-line NWE and a plurality of sub word-lines SWL, conjunction regions CJ, sub word-line driver regions SWD, sense amplifier regions SA and sub memory cell array regions SMCA.

In some exemplary embodiments, word selection signal lines PX, main word-lines NEW, sub word-lines SWL, column selection signal lines CSL, local input-output data lines LIO and global input-output data lines GIO may be formed in an upper portion of the memory cell array region MCA. The power lines are omitted in FIG. 14 for convenience of illustration.

In the memory cell array region MCA, the conjunction regions CJ, the sub word-line driver regions SWD, the sense amplifier regions SA and the sub memory cell array regions SMCA are disposed repeatedly in a row direction X and a column direction Y. The memory cells MC are formed in the sub memory cell array regions SMCA and connected to the sub word-lines SWL and the bit-lines BL. The data may be written to or read from the memory cells MC in response to the signals transferred through the word selection signal lines PX, the main word-lines NWE and the column selection signal lines CSL.

The column decoder CDEC generates signals on column select signal lines CSL to select one or more columns of the array for reading or writing according to a supplied column address COL_ADDR. The row decoder XDEC decodes the row address ROW_ADDR to generate signals for selecting one of the main word-lines NWE and signals for selecting one of the word line selection lines PX.

The main word-lines NWE extend in the row direction X on the sub word-line driver regions SWD and the sub memory cell array regions SMCA, and the word selection signal lines PX and the local input-output data lines LIO extend in the row direction X on the conjunction regions CJ and the sense amplifier regions SA. The column selection signal lines CSL and the global input-output data lines GIO extend in the column direction Y on the sense amplifier regions SA and the sub memory cell array regions SMCA.

Figure 15:
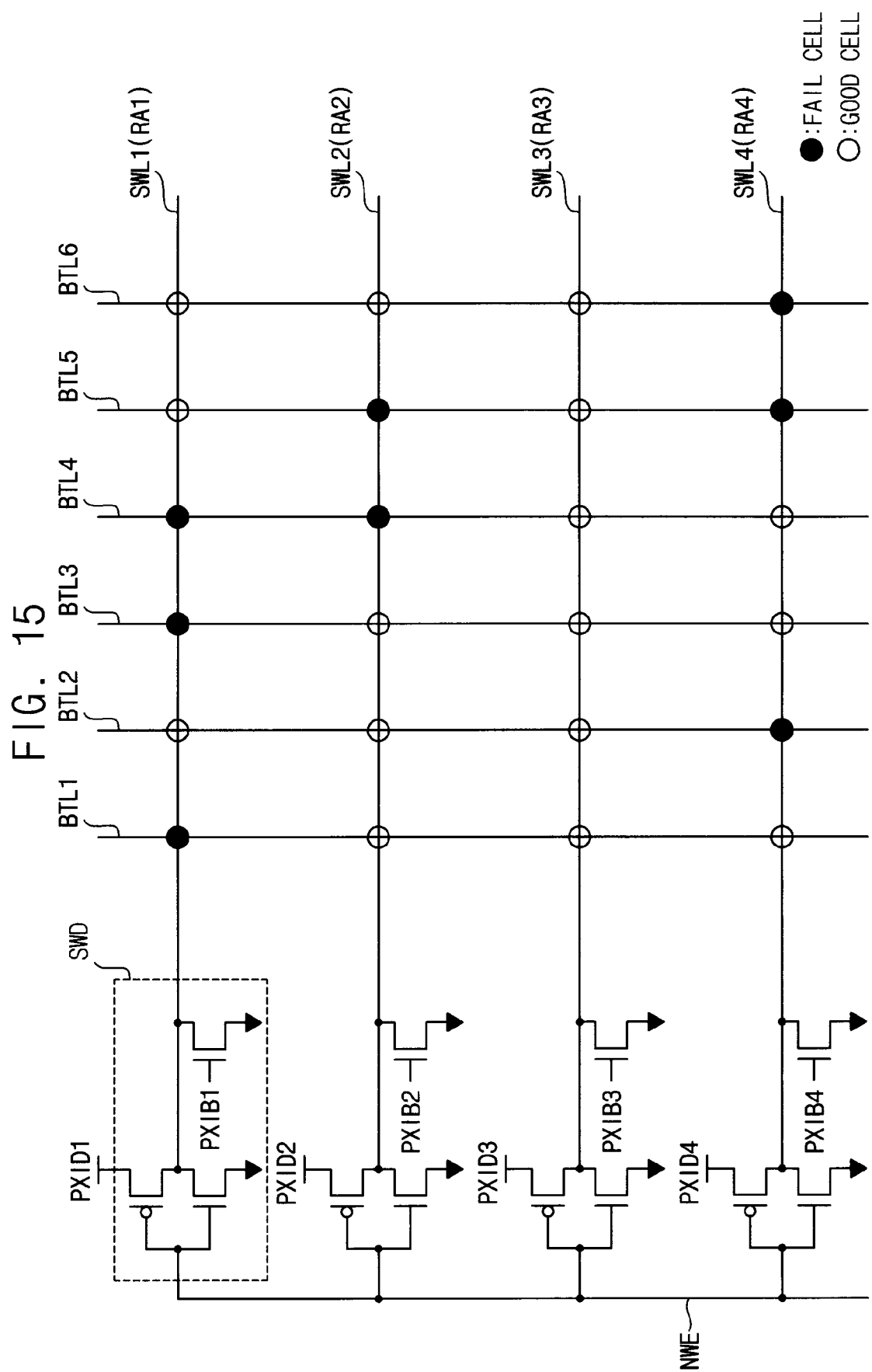
FIGS. 15 and 16 are diagrams illustrating a determination of error attribute for a method of controlling repair of a semiconductor memory device according to exemplary embodiments.
Figure 16:
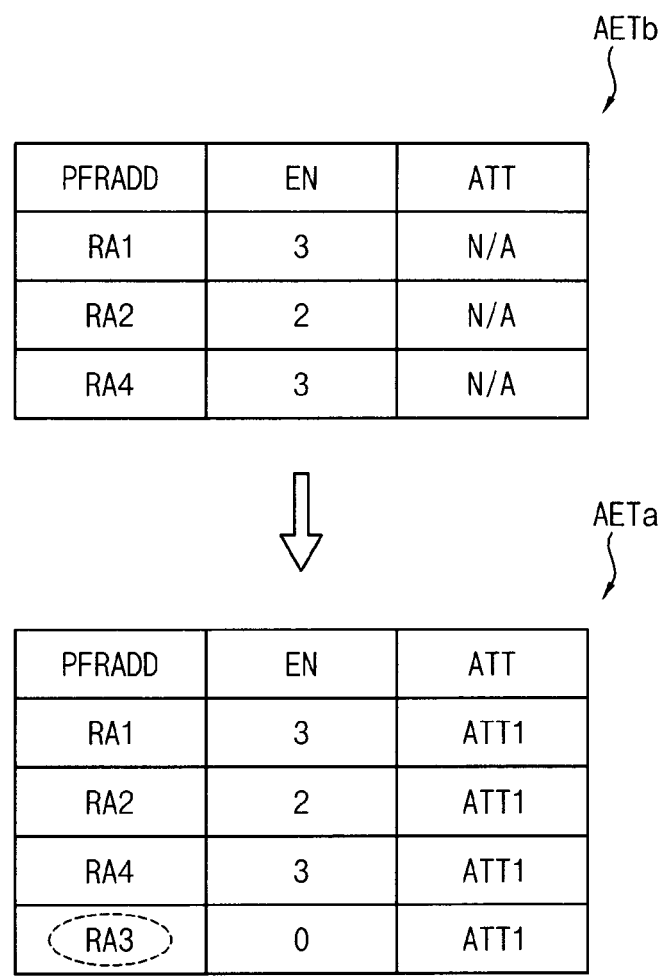

FIGS. 15 and 16 are diagrams illustrating a determination of error attribute for a method of controlling repair of a semiconductor memory device according to exemplary embodiments.

FIG. 15 illustrates an example that a plurality of sub word-lines SWL1~SWL4 are connected to one main word-line NWE through sub word-line drivers SWD. Signals PXID1~PXID4 and PXIB1~PXIB4 are generated by address decoding.

The sub word-lines SWL1~SWL4 connected to the same main word-line NWE have a structural correlation. For example, when a fault is occurred in the main word-line NWE and/or a driver to drive the main word-line NWE, the number of the sub word-lines having the errors or the sum of errors in the sub word-lines SWL1~SWL4 may be increased. In this case, the number of errors of the sub word-line SWL3 is zero as illustrated in FIG. 16, but also the sub word-line SWL3 may be rapidly developed to the failure. To prevent such possibility of the failure, the error attribute may be imposed to an address group including the row addresses RA1~RA4 corresponding to all of the sub word-lines SWL1~SWL4 connected to the same main word-line NWE, and the address group RA1~RA4 may be stored in the accumulated error table as the candidate defective row addresses.

In some exemplary embodiments, the post package repair operation may be performed with respect to all of the row addresses RA1~RA4 included in the address group when a sum of the number of correctable errors of the address group is greater than a number of risk errors that is greater than a second reference number. For example, the post package repair operation may be performed with respect to the row address RA3 even having no error. In some embodiments, the second reference number may be stored in a register included in a memory controller or a semiconductor memory device.

In FIG. 16, AETb indicates the accumulated error table before determining the error attribute ATT1, and AETa indicates the accumulated error table after determining the error attribute ATT1.

In some exemplary embodiments, main address error attribute may be determined with respect to the address group including row addresses of a plurality of sub word-lines corresponding to a main word-line of the semiconductor memory device when the number of the candidate defective row addresses included in the address group is greater than a third reference number. In the example of FIGS. 15 and 16, the number of the candidate defective row addresses corresponds to three and the third reference number is assumed to be two. In some embodiments, the third reference number may be stored in a register included in a memory controller or a semiconductor memory device.

FIG. 17 is a diagram illustrating an accumulated error table for a method of controlling repair of a semiconductor memory device according to exemplary embodiments.

In some exemplary embodiments, candidate defective column addresses having correctable errors with respect to each of the candidate defective row addresses may be further stored in the accumulated error table AET as the accumulated error information AEI.

In comparison with the accumulated error table AET1 of FIG. 11, the accumulated error table AET of FIG. 17 may further include the candidate defective column addresses CAa~CAk with respect to each of the candidate defective row addresses RAa~ARf.

In this case, a column error attribute ATT2 may be further determined with respect to a candidate defective column address CAb when a number of the candidate defective row addresses each including the candidate defective column address CAb are greater than a fourth reference number.

In the example of FIG. 17, the number of the candidate defective row addresses RAa, RAc, RAd and RAf including the same candidate defective column address CAb is four. If the fourth reference number is set to be three, the column error attribute ATT2 may be imposed to the candidate defective column address CAb. The post package repair operation may be performed with respect to the candidate defective column address CAb to which the column error attribute ATT2 is imposed.

Figure 18:
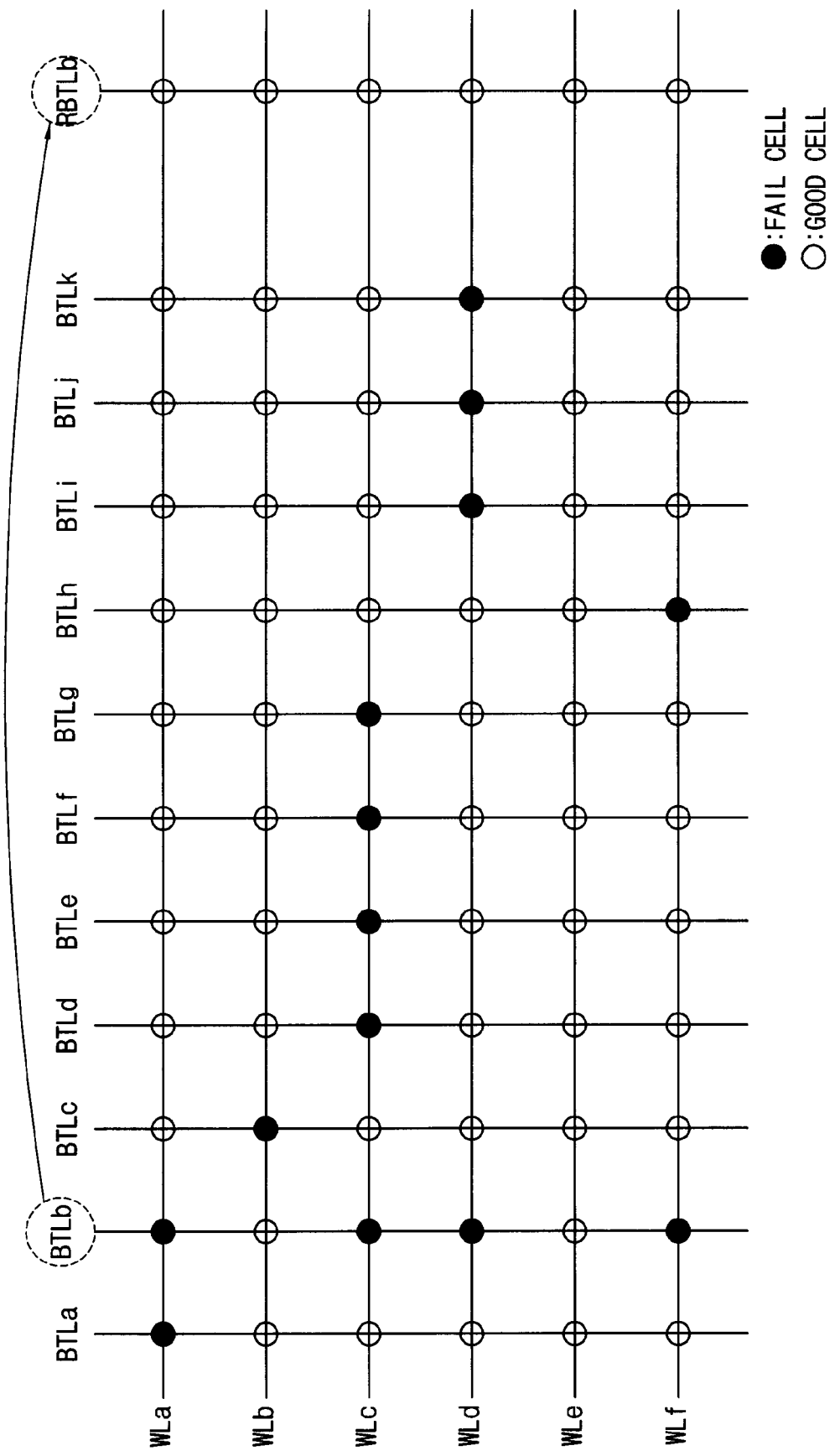
FIG. 18 illustrates a column repair according to method of controlling repair of a semiconductor memory device according to exemplary embodiments.

FIG. 18 illustrates a column repair according to method of controlling repair of a semiconductor memory device according to exemplary embodiments.

Referring to FIG. 18, a post package repair operation to replace a bit-line BTLb with a redundancy bit-line RBTLb with respect to a candidate defective column coupled to the bit-line BTLb based on the accumulated error table AET of FIG. 17.

Figure 19:
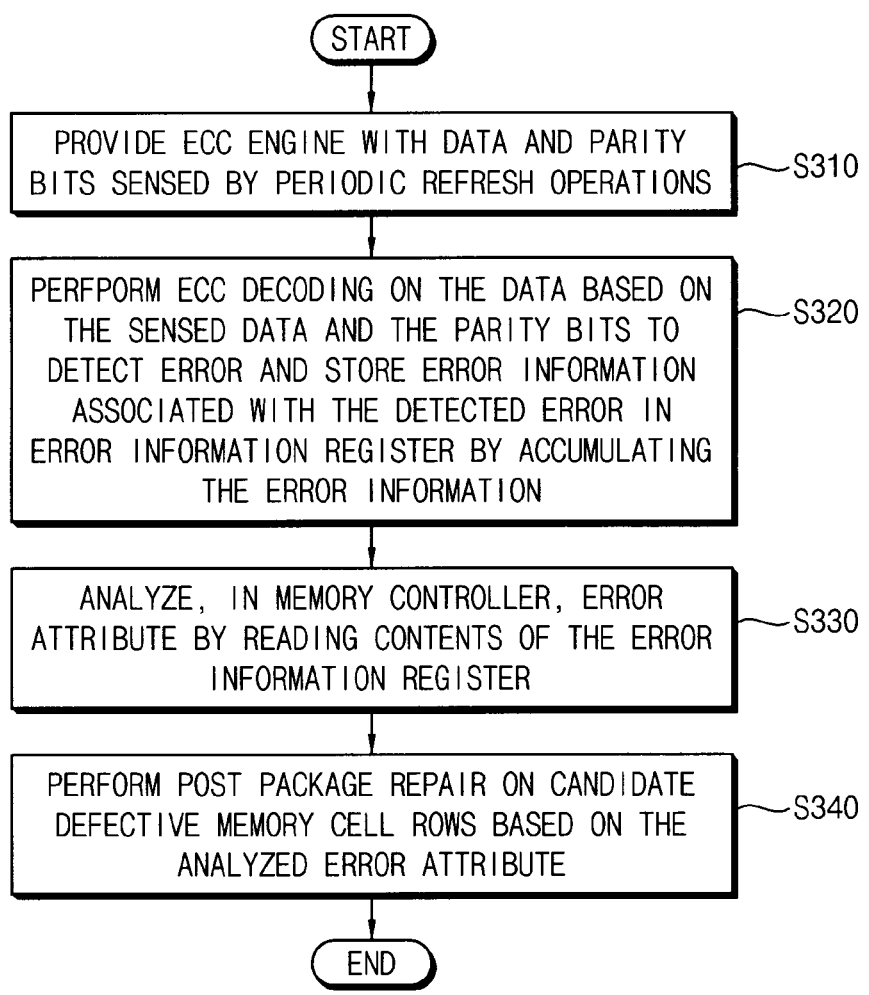
FIG. 19 is a flow chart illustrating a method of controlling a repair of a semiconductor memory device according to exemplary embodiments.

FIG. 19 is a flow chart illustrating a method of controlling a repair of a semiconductor memory device according to exemplary embodiments.

Referring to FIGS. 1 through 19, there is provided a method of controlling repair of a semiconductor memory device 200. The semiconductor memory device 200 includes a memory cell array 300 and an ECC engine 400. The memory cell array 300 may include a plurality of memory cell rows and each of the plurality of memory cell rows may include a plurality of volatile memory cells.

In the method of controlling repair of a semiconductor memory device 200, an I/O gating circuit 290 provides the ECC engine 400 with sensed data and parity bits sensed through refresh operations on the memory cell rows (S310). The control logic circuit 210 controls the ECC engine 400 to store error information in an error information register 480 by accumulating location information of correctable errors when the correctable errors are detected through ECC decoding operation performed on the sensed data based on the parity bits (S320).

The memory controller 100 performs a run-time repair operation on at least one of the memory cell rows or at least a portion of one memory cell row based on reading the error information stored in the error information register 480 and a fifth reference number (S330, S340).

For performing the run-time repair operation, the memory controller 100 reads the error information stored in the error information register 480 as the accumulated error information AEI and analyzes error attribute of candidate defective memory cell rows, each including correctable errors, based on comparison of a number of correctable errors with the fifth reference number (S330).

The memory controller 100 performs a post package repair operation on at least one target defective memory cell row of the candidate defective memory cell rows based on the analysis (S340). The at least one target defective memory cell row of the candidate defective memory cell rows may include correctable errors greater than the fifth reference number.

The method of controlling repair of FIG. 19 is performed by the semiconductor memory device 200 in response to a first mode register set command from the memory controller 100. In some embodiments, the post package repair operation may be performed during an idle period of the memory system.

Figure 20:
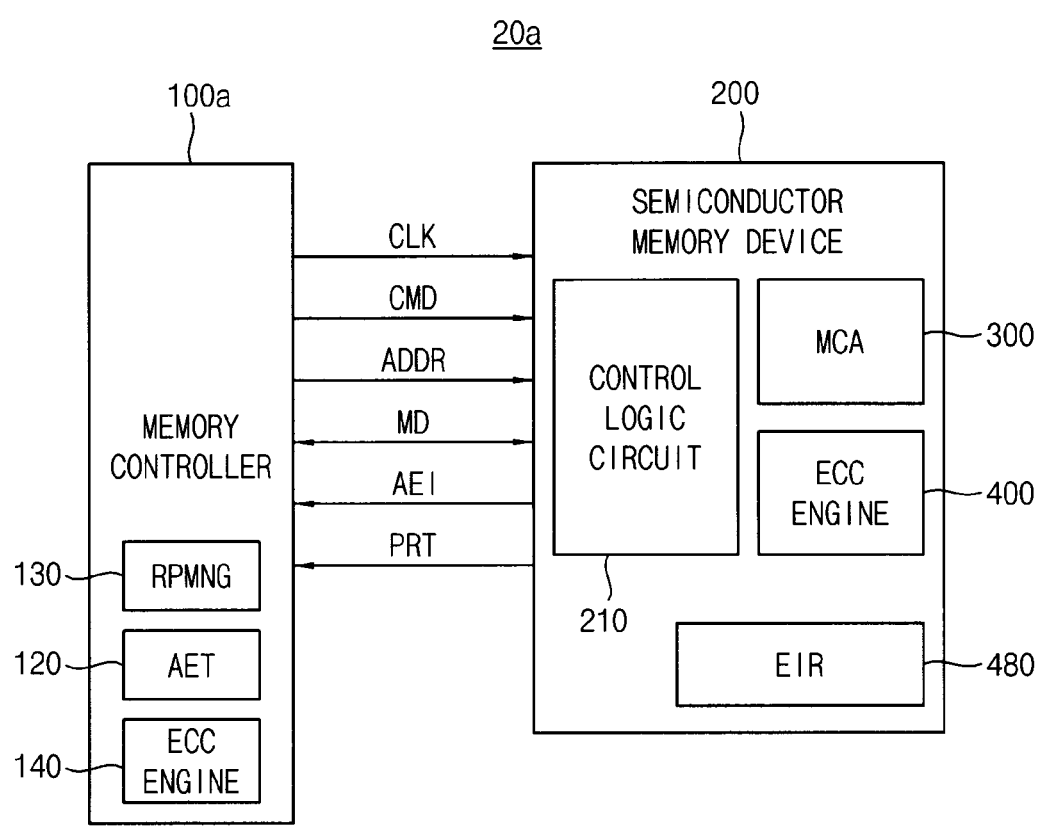
FIG. 20 is a block diagram illustrating a memory system according to exemplary embodiments.

FIG. 20 is a block diagram illustrating a memory system according to exemplary embodiments.

Referring to FIG. 20, a memory system 20a may include a memory controller 100a and a semiconductor memory device 200.

The memory system 20a of FIG. 20 differs from the memory system 20 of FIG. 1 in that the memory controller 100a further include an ECC engine (a second ECC engine) 140 and the semiconductor memory device 200 further provides the parity bits PRT to the memory controller 100a.

Referring to FIG. 20, the repair manager 130 may determine a first error attribute of each of the candidate defective memory rows based on the accumulated error information AEI including a number of correctable errors and a fifth reference number. The repair manager 130 may apply a second mode register set command and victim addresses to the semiconductor memory device 200 based on the determined first error attribute. The control logic circuit 210 disables the ECC decoder 430 in the ECC engine 400 in response to the second mode register set command. The control logic circuit 210 may control the I/O gating circuit such that data and parity bits stored in adjacent memory cell rows designated by the victim addresses are provided to the memory controller 100a while the ECC decoder 430 is disabled. The adjacent memory cell rows associated with the victim addresses are disposed adjacent to memory cell rows associated with some of the candidate defective row addresses.

The second ECC engine 140 may calculate the number of correctable errors of each of the victim addresses by performing an ECC decoding on the data from each of the adjacent memory cell rows based on the parity bits from each of the adjacent memory cell rows and may determine a second error attribute of each of the victim addresses based on a comparison of the calculated number of correctable errors with the fifth reference number. The repair manager 130 may control the semiconductor memory device 200 to perform a post package repair operation on target victim addresses of the victim addresses, and each of the target victim addresses includes the calculated number of correctable errors equal to or greater than the fifth reference number.

Figure 21:
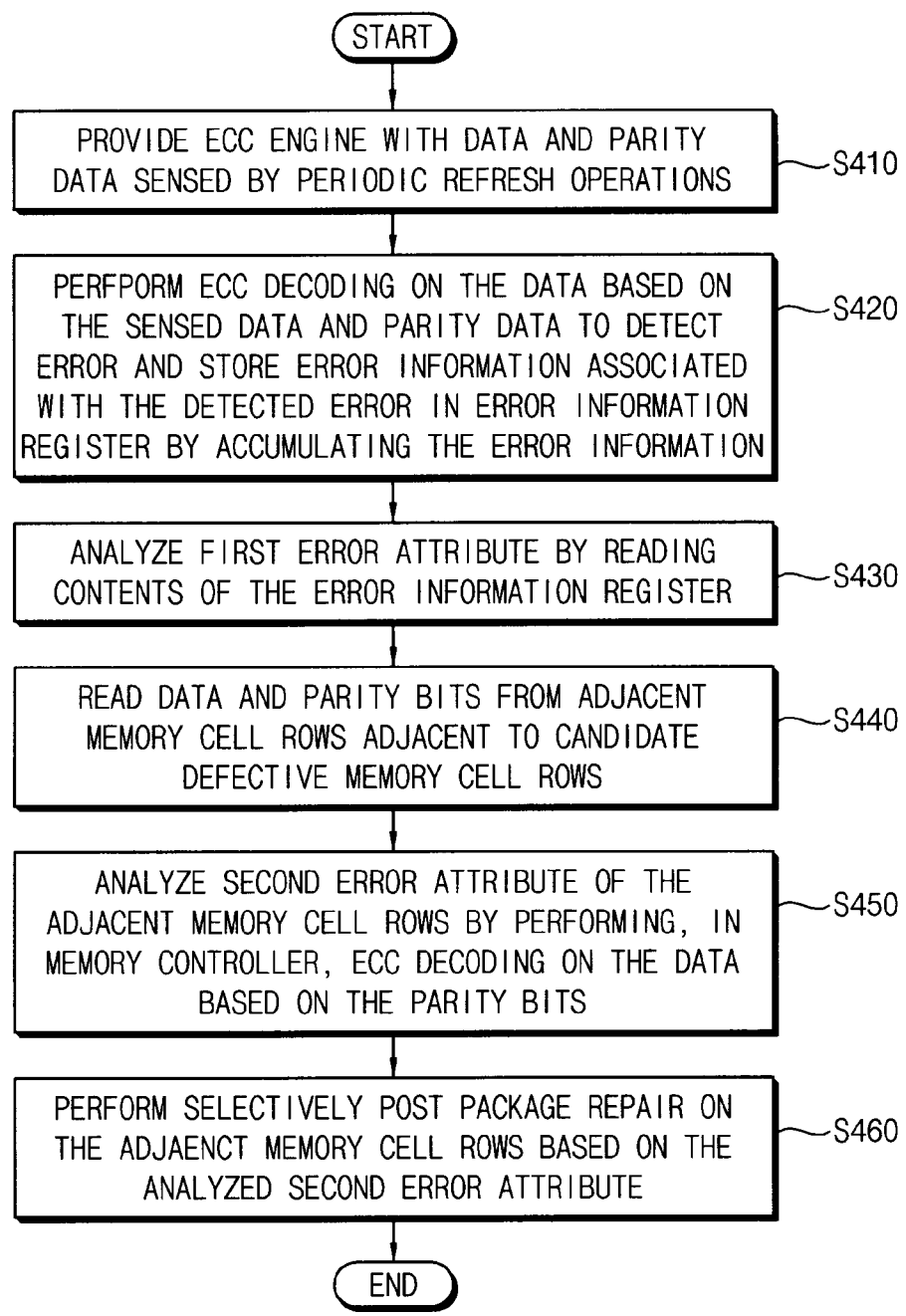
FIG. 21 is a flow chart illustrating a method of controlling a repair of a semiconductor memory device of FIG. 20 according to exemplary embodiments.

FIG. 21 is a flow chart illustrating a method of controlling a repair of a semiconductor memory device of FIG. 20 according to exemplary embodiments.

Referring to FIGS. 20 and 21, sensed data and parity bits sensed through refresh operations are provided to the ECC engine 400 (S410). The control logic circuit controls the ECC engine 400 to store error information in an error information register 480 by accumulating location information of correctable errors when the correctable errors are detected through ECC decoding operation performed on the sensed data based on the parity bits (S420).

The memory controller 100 reads the error information stored in the error information register 480 as the accumulated error information AEI and analyzes a first error attribute of each of candidate defective memory cell rows including correctable errors, based on comparison of the number of correctable errors with a reference number (S430).

The memory controller 100 reads data and parity bits stored in adjacent memory cell rows designated by victim addresses adjacent to memory cell rows associated with some of the candidate defective row addresses based on the first error attribute (S440).

The second ECC engine 140 in the memory controller 100a performs an ECC decoding on the data and parity bits read from the adjacent memory cell rows to determine a second error attribute of the adjacent memory cell rows (S450). The memory controller 100a may selectively perform a post package repair operation on at least some of the adjacent memory cell rows based on the second error attribute (S460).

Figure 22:
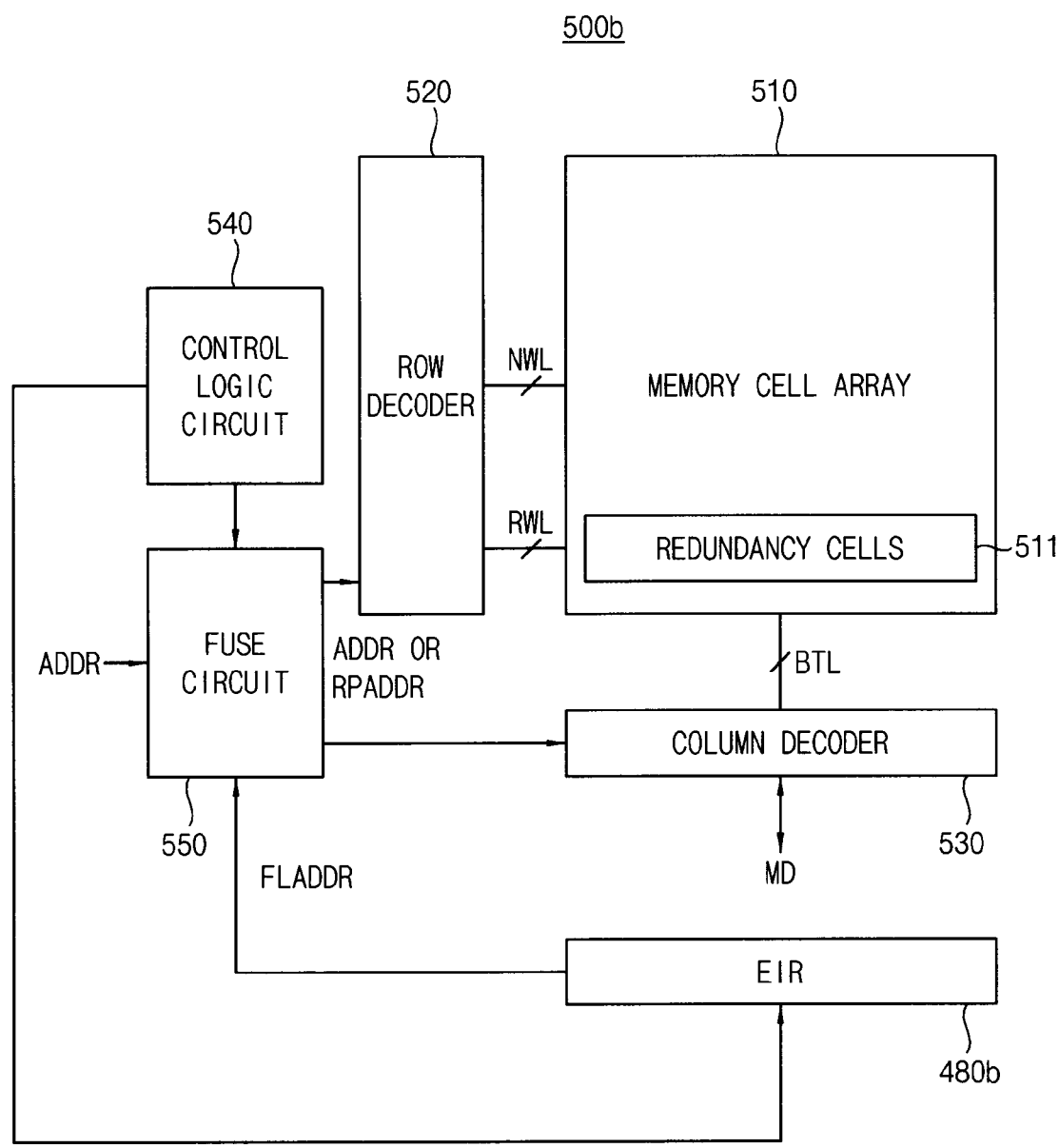
FIG. 22 is a block diagram illustrating a semiconductor memory device performing a post package repair operation according to example embodiments.

FIG. 22 is a block diagram illustrating a semiconductor memory device performing a post package repair operation according to example embodiments. For convenience of illustration and description, only components for describing the post package repair operation are illustrated.

A semiconductor memory device 500b of FIG. 22 differs from the semiconductor memory device 500a of FIG. 13 in that the semiconductor memory device 500b operates in response to a third mode register set command and an error information register 480b provides a defective address FLADDR to the fuse circuit 550.

The error information register 480b provides the defective row address FLADDR to the fuse circuit 550 as the repair address RPADDR instead of providing the accumulated error information to the memory controller 100, and the fuse circuit 550 is set by the control logic circuit 540 to convert the defective address FLADDR to the repair address RPADDR and output the repair address RPADDR to the row decoder 520 or the column decoder 530.

Figure 23:
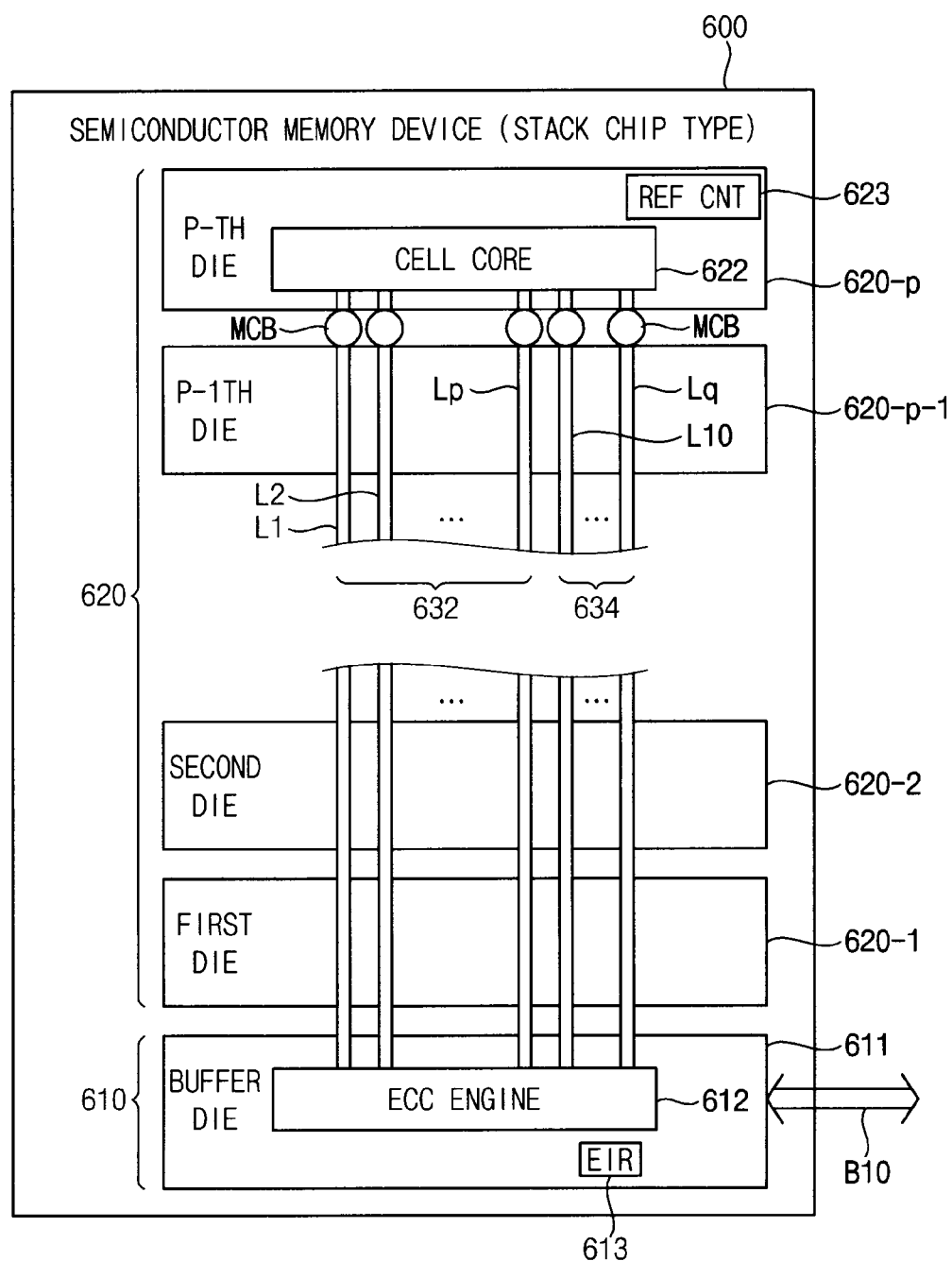
FIG. 23 is a block diagram illustrating a semiconductor memory device according to exemplary embodiments.

FIG. 23 is a block diagram illustrating a semiconductor memory device according to exemplary embodiments.

Referring to FIG. 23, a semiconductor memory device 600 may include a buffer die 610 and a first group of dies 620.

The buffer die 610 may include at least one buffer or logic die 611. The first group of dies 620 may include a plurality of memory dies 620-1 to 620-p which is stacked on the buffer die 610 and conveys data through a plurality of through substrate via lines, for example, through silicon via (TSV) lines.

Each of the memory dies 620-1 to 620-p may include a cell core 622 that includes a plurality of memory cells coupled to a plurality of word-lines and a plurality of bit-lines and a refresh counter 623 that generates refresh addresses.

The buffer die 610 may include an ECC engine 612 which corrects a transmission error using the transmission parity bits when a transmission error is detected from the transmission data received through the TSV liens and generates error-corrected data and an error information register 613 that stores error information. The ECC engine 612 may employ the ECC engine 400 of FIG. 8 and the error information register 613 may employ the error information register 480 of FIG. 7.

The semiconductor memory device 600 may be a stack chip type memory device or a stacked memory device which conveys data and control signals through the TSV lines. The TSV lines may be also called 'through electrodes'.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A group of data TSV lines 632 which is formed at one memory die 620-p may include a plurality of TSV lines L1 to Lp, and a group of parity TSV lines 634 may include a plurality of TSV lines L10 to Lq.

The TSV lines L1 to Lp of the group of data TSV lines 632 and the parity TSV lines L10 to Lq of the group of parity TSV lines 634 may be connected to micro bumps MCB which are correspondingly formed among the memory dies 620-1 to 620-p.

Each of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller 100 through the data bus B10.

Figure 24:
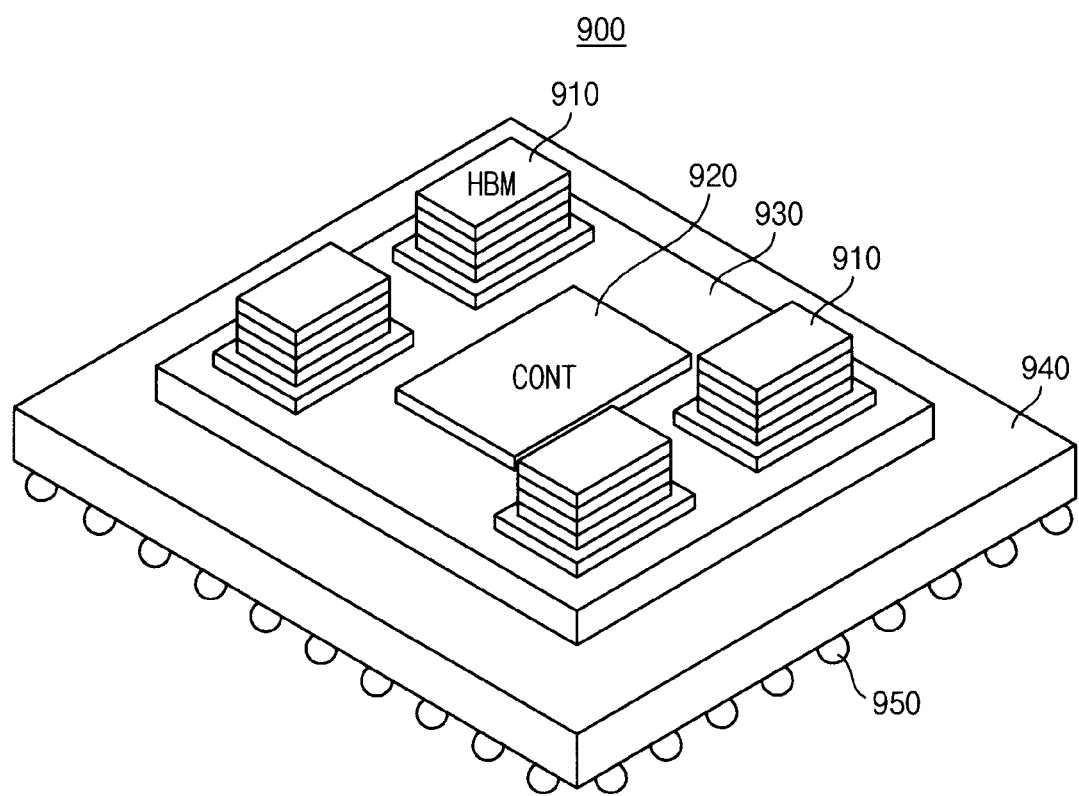
FIG. 24 is a diagram illustrating a semiconductor package including the stacked memory device according to exemplary embodiments.

FIG. 24 is a diagram illustrating a semiconductor package including the stacked memory device according to exemplary embodiments.

Referring to FIG. 24, a semiconductor package 900 may include one or more stacked memory devices 910 and a memory controller (CONT) 920.

The stacked memory devices 910 and the memory controller 920 may be mounted on an interposer 930, and the interposer 930 on which the stacked memory devices 910 and the memory controller 920 are mounted may be mounted on a package substrate 940. The memory controller 920 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. The buffer die may include an ECC engine and an error information register and each of the memory dies may include a memory cell array.

The plurality of stacked memory devices 910 may be mounted on the interposer 930, and the memory controller 920 may communicate with the plurality of stacked memory devices 910.

FIG. 25 illustrates a block diagram of a solid state disk or solid state drive (SSD) according to exemplary embodiments.

Referring to FIG. 25, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may operate as storage media of the SSD 1000.

The SSD controller 1200 is connected to the nonvolatile memory devices 1100 through multiple channels CH1, CH2, and CH3 to CHi. The SSD controller 1200 includes one or more processors 1210, a DRAM (a volatile memory device)

1220, an ECC block 1230, a host interface 1250, and a nonvolatile memory interface 1260.

The DRAM 1220 operates as a buffer memory and stores data used to drive the SSD controller 1200. The DRAM 1220 may buffer data to be used in program operation. The DRAM 1220 may employ the semiconductor memory device 200 of FIG. 3 and may include an ECC engine and an error information register. The DRAM 1220 performs ECC decoding during refresh operation and accumulate error information in the error information register.

The ECC block 1230 calculates error correction code values of data to be programmed at a writing operation and corrects an error of read data using an error correction code value at a read operation. In a data recovery operation, the ECC block 1230 corrects an error of data recovered from the nonvolatile memory devices 1100.

Aspects of the present inventive concept may be applied to systems using semiconductor memory devices that employ volatile memory cells and an ECC engine.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the spirit and scope of the present inventive concept as set forth in the following claims.

What is claimed is:

1. A semiconductor memory device comprising:
a memory cell array including a plurality of memory cell rows, each of the plurality of memory cell rows including a plurality of volatile memory cells;
an error correction code (ECC) engine;
an input/output (I/O) gating circuit connected between the memory cell array and the ECC engine;
an error information register; and
a control logic circuit configured to control the ECC engine, the I/O gating circuit and the error information register based on a command and address received from an external memory controller,
wherein the I/O gating circuit is configured to provide the ECC engine with codewords which are read from the memory cell array through refresh operations on the plurality of memory cell rows,
wherein the ECC engine is configured to perform an ECC decoding on main data of the codewords based on parity bits of the codewords and is configured to provide error generation signals to the control logic circuit in response to detecting correctable errors with respect to a corresponding address resulting from performing the ECC decoding, and
wherein the control logic circuit is configured to:
store error information in the error information register by accumulating location information having the correctable errors, based on the error generation signals,
store as the error information in the error information register, candidate defective row addresses of candidate defective memory cell rows in which the correctable errors occur, of the plurality of memory cell rows,
control the error information register to provide the error information accumulated in the error information register as accumulated error information, in response to a register read command from external memory controller, and
provide a notification signal to the external memory controller when storage space of the error information register is full by accumulating the error information.

2. The semiconductor memory device of claim 1, further comprising:
a fuse circuit configured to store replacement row addresses of the candidate defective row addresses, corresponding to target defective row addresses of the candidate defective row addresses,
wherein each of the target defective row addresses includes an amount of correctable errors whose number is equal to or greater than a reference number, and
wherein the fuse circuit is configured to perform a post package repair operation by outputting a replacement row address corresponding to one of the target defective row addresses when an access address from the external memory controller matches one of the target defective row addresses.

3. The semiconductor memory device of claim 1, wherein the control logic circuit is configured to store, in the error information register, the number of correctable errors corresponding to each of the candidate defective row addresses.

4. The semiconductor memory device of claim 3, wherein the control logic circuit is configured to perform a run-time repair operation on at least one of the candidate defective row addresses based on the error information accumulated in the error information register.

5. The semiconductor memory device of claim 4, wherein the control logic circuit is configured to perform the run-time repair operation by performing a post package repair operation on at least one of the candidate defective memory cell rows, which includes the number of correctable errors, which is equal to or greater than a reference number.

6. The semiconductor memory device of claim 3, wherein the control logic circuit is configured to:
store candidate defective column addresses, wherein the correctable errors occur with respect to each of the candidate defective row addresses, and
perform a post package repair operation on a candidate defective column address when a number of the candidate defective row addresses that include the candidate defective column address is equal to or greater than a reference number.

7. The semiconductor memory device of claim 1, further comprising:
at least one buffer die; and
a plurality of memory dies stacked on the at least one buffer die and conveying data through a plurality of through substrate via lines,
wherein each of the memory dies includes the memory cell array, and
wherein the at least one buffer die includes the ECC engine and the error information register.

8. A memory system comprising:
a semiconductor memory device; and
a memory controller configured to control the semiconductor memory device, wherein the semiconductor memory device comprises:
a memory cell array including a plurality of memory cell rows, each of the plurality of memory cell rows including a plurality of volatile memory cells;
a first error correction code (ECC) engine;
an input/output (I/O) gating circuit connected between the memory cell array and the first ECC engine;
an error information register; and
a control logic circuit configured to control the first ECC engine, the I/O gating circuit and the error information register based on a command and address received from the memory controller, wherein the I/O gating circuit is configured to provide the first ECC engine with codewords which are read from the memory cell array through refresh operations on the plurality of memory cell rows, wherein the first ECC engine is configured to perform an ECC decoding on main data of the codewords based on parity bits of the codewords and is configured to provide error generation signals to the control logic circuit in response to detecting correctable errors with respect to a corresponding address resulting from performing the ECC decoding, wherein the control logic circuit is configured to:

store error information in the error information register by accumulating location information having the correctable errors, based on the error generation signals, store as the error information in the error information register, candidate defective row addresses of candidate defective memory cell rows in which the correctable errors occur, of the plurality of cell rows, and control the error information register to provide the error information accumulated in the error information register as accumulated error information, in response to a register read command from the memory controller, and wherein the memory controller is configured to:

receive the accumulated error information from the error information register, determine a first error attribute of each of the cans date defective row addresses based on comparison of the number of correctable errors of each of the candidate defective row addresses with a first reference number, and apply a mode register set command to the semiconductor memory device based on the determined first error attribute.

9. The memory system of claim 8, wherein
the control logic circuit is configured to perform a post package repair operation on at least one of the candidate defective memory cell rows, which includes the number of correctable errors equal to or greater than the first reference number, based on the mode register set command.

10. The memory system of claim 9, wherein the control logic circuit is configured to store candidate defective column addresses, wherein the correctable errors occur with respect to each of the candidate defective row addresses, and wherein the memory controller is configured to determine the first error attribute further based on a comparison of a number of the candidate defective row addresses that include a first candidate defective column address of the candidate defective column addresses with a second reference number.

11. The memory system of claim 10, wherein the control logic circuit is configured to perform a post package repair operation on the first candidate defective column address when the number of the candidate defective row addresses that include the first candidate defective column address is equal to or greater than the second reference number.

12. The memory system of claim 8, wherein:
the control logic circuit is configured to disable an ECC decoder in the first ECC engine in response to the mode register set command.

13. The memory system of claim 12, wherein the control logic circuit is configured to control the I/O gating circuit such that main data and parity bits stored in adjacent memory cell rows designated by victim addresses adjacent to memory cell rows associated with some of the candidate defective row addresses are provided to the memory controller while the ECC decoder is disabled.

14. The memory system of claim 13, wherein the memory controller includes a second ECC engine, wherein the second ECC engine is configured to calculate a number of correctable errors of each of the victim addresses by performing an ECC decoding on the main data from each of the adjacent memory cell rows based on the parity bits from each of the adjacent memory cell rows and is configured to determine a second error attribute of each of the victim addresses based on a comparison of the calculated number of correctable errors with a second reference number, and wherein the memory controller is configured to control the semiconductor memory device to perform a post package repair operation on target victim addresses of the victim addresses, and each of the target victim addresses includes the number of calculated correctable errors equal to or greater than the second reference number.

15. The memory system of claim 8, wherein the control logic circuit is configured to perform a post package repair operation on at least one of the candidate defective memory cell rows, which includes the number of correctable errors which is equal to or greater than a reference number, based on the mode register set command.

16. A method of controlling repair of a semiconductor memory device including an error correction code (ECC) engine, an error information register and a memory cell array including a plurality of memory cell rows, each including a plurality of volatile memory cells, the method comprising:

providing the ECC engine with codewords including main data and parity bits read from the memory cell array through refresh operations on the plurality of memory cell rows;

by the ECC engine, performing an ECC decoding on the main data based on the parity bits to detect correctable errors with respect to a corresponding address;

storing error information in the error information register by accumulating location information having the correctable errors; and performing a run-time repair operation with respect to the semiconductor memory device to repair the correctable errors based on the error information stored in the error information register, wherein the performing of the run-time repair operation includes;

performing a post package repair operation on target d row addresses of candidate defective row addresses of the plurality of memory cell rows, wherein the correctable errors occur in each of the candidate defective row addresses, and wherein each of the target defective row addresses includes a number of correctable errors equal to or greater than a reference number.

* * * * *